(12) United States Patent
Misaki

(10) Patent No.: US 11,488,990 B2
(45) Date of Patent: Nov. 1, 2022

(54) ACTIVE MATRIX SUBSTRATE AND PRODUCTION METHOD THEREOF

(71) Applicant: Sharp Kabushiki Kaisha, Sakai (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 263 days.

(21) Appl. No.: 16/860,499

(22) Filed: Apr. 28, 2020

(65) Prior Publication Data

US 2020/0343272 A1    Oct. 29, 2020

Related U.S. Application Data

(60) Provisional application No. 62/839,936, filed on Apr. 29, 2019.

(51) Int. Cl.

| H01L 27/12 | (2006.01) |
|---|---|
| H01L 29/00 | (2006.01) |
| G02F 1/1362 | (2006.01) |
| G02F 1/1368 | (2006.01) |

(52) U.S. Cl.
CPC .......... H01L 27/127 (2013.01); G02F 1/1368 (2013.01); G02F 1/136286 (2013.01); H01L 27/1262 (2013.01); G02F 1/136295 (2021.01)

(58) Field of Classification Search
CPC ............. H01L 27/1262; H01L 27/1222; H01L 27/1248; H01L 27/127; H01L 29/78696; H01L 29/786; H01L 29/66742; H01L 29/78618; G02F 1/136286; G02F 1/1368; G02F 1/136295

See application file for complete search history.

(56) References Cited

U.S. PATENT DOCUMENTS

| 8,319,216 B2* | 11/2012 | Akimoto | ........... H01L 29/42384 |
|---|---|---|---|
| | | | 257/E29.291 |
| 9,054,203 B2* | 6/2015 | Miyairi | ............... H01L 29/7869 |
| 9,159,749 B2* | 10/2015 | Wang | ................ H01L 29/78696 |

(Continued)

FOREIGN PATENT DOCUMENTS

| JP | 2010-141308 A | 6/2010 |
|---|---|---|
| JP | 2014-187782 A | 10/2014 |

(Continued)

*Primary Examiner* — Nikolay K Yushin

(74) *Attorney, Agent, or Firm* — Keating & Bennett, LLP

(57) ABSTRACT

An active matrix substrate includes a thin film transistor that includes a gate electrode, a first inorganic insulating film that covers the gate electrode, a second inorganic insulating film that is disposed on the first inorganic insulating film and that has an opening overlapping the gate electrode, a source electrode and a drain electrode disposed on the second inorganic insulating film, and a semiconductor layer that overlaps the gate electrode in an opening of the first inorganic insulating film and that covers the source electrode and the drain electrode. Regarding a surface of the first inorganic insulating film in a first region overlapping the opening of the first inorganic insulating film and a surface in a second region other than the first region, the surfaces being arranged nearer to the second inorganic insulating film, the surface in the first region is lower than the surface in the second region.

7 Claims, 17 Drawing Sheets

(56) References Cited

U.S. PATENT DOCUMENTS

| | | | | |
|---|---|---|---|---|
| 2010/0117076 A1* | 5/2010 | Akimoto | ........... | H01L 29/42384 |
| | | | | 257/E21.414 |
| 2010/0117079 A1 | 5/2010 | Miyairi et al. | | |
| 2012/0292610 A1* | 11/2012 | Wang | ................ | H01L 29/66969 |
| | | | | 257/66 |
| 2013/0334525 A1* | 12/2013 | Miyairi | ............... | H01L 29/7869 |
| | | | | 257/43 |
| 2015/0187948 A1* | 7/2015 | Misaki | .................. | G02F 1/1368 |
| | | | | 257/43 |

FOREIGN PATENT DOCUMENTS

| | | |
|---|---|---|
| JP | 2014-232880 A | 12/2014 |
| JP | 2016-036043 A | 3/2016 |

* cited by examiner

ACTIVE MATRIX SUBSTRATE AND PRODUCTION METHOD THEREOF

BACKGROUND

1. Field

The present disclosure relates to an active matrix substrate and a production method thereof.

2. Description of the Related Art

Active matrix substrates in which a plurality of pixels are arranged in a matrix on the substrate and in which a thin film transistor (TFT) is disposed on a per-pixel basis have been provided. Such an active matrix substrate is disclosed in, for example, Japanese Unexamined Patent Application Publication No. 2010-141308. In the active matrix substrate, a gate electrode of the TFT is covered with a gate insulating layer, a source electrode and a drain electrode are disposed on the gate insulating layer, and a semiconductor layer is disposed above the source electrode and the drain electrode.

To reduce the resistance of a gate wiring line disposed on a pixel of the above-described active matrix substrate, the film thickness of a gate electrode may be increased in the same manner as for the gate wiring line. Increasing the film thickness of the gate electrode reduces the distance between the gate electrode and the source electrode and the distance between the gate electrode and the drain electrode so as to reduce the withstand voltage of the gate insulating film in these portions. As a result, electrostatic breakdown of the gate insulating film tends to occur. If the film thickness of the gate insulating film is increased in accordance with the film thickness of the gate electrode, the film thickness of the portion of the gate insulating film corresponding to a channel region is also increased, and an on-current of the TFT is decreased. That is, to increase the on-current of the TFT, it is favorable to increase the film thickness of the portion of the gate insulating film that overlaps the source electrode or the drain electrode, and to increase the withstand voltage, it is favorable to decrease the film thickness of the portion of the gate insulating film that overlaps the channel region.

SUMMARY

An active matrix substrate according to an aspect of the disclosure includes a substrate and a thin film transistor, wherein the thin film transistor includes a gate electrode disposed on the substrate, a first inorganic insulating film that covers the gate electrode, a second inorganic insulating film that is disposed on the first inorganic insulating film and that has an opening in a region overlapping the gate electrode in plan view, a source electrode and a drain electrode that overlap the gate electrode in plan view and that cover part of the second inorganic insulating film, and a semiconductor layer that overlaps the gate electrode in the opening in plan view and that covers the source electrode and the drain electrode, and regarding a surface of the first inorganic insulating film in a first region overlapping the opening in plan view and a surface of the first inorganic insulating film in a second region other than the first region, the surfaces being arranged nearer to the second inorganic insulating film with respect to the first inorganic insulating film, the position of the surface in the first region is lower than the position of the surface in the second region.

DESCRIPTION OF THE EMBODIMENTS

Figure 1:
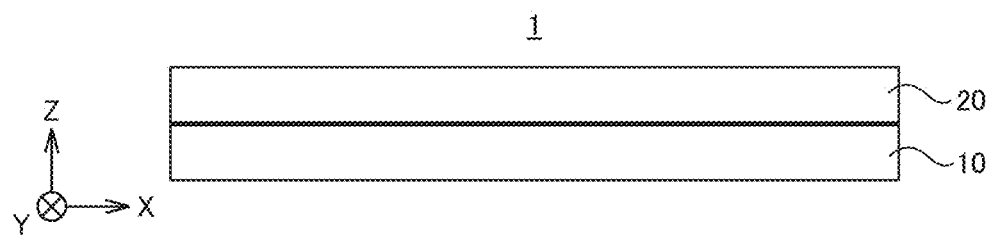
FIG. 1 is a schematic sectional view showing the configuration of a display device in a first embodiment.

The embodiments according to the present disclosure will be described below in detail with reference to the drawings. In the drawings, the same or corresponding portions are indicated by the same references and duplicate explanations may be omitted.

First Embodiment

In the present embodiment, an active matrix substrate used for a display device will be described.
Configuration FIG. 1 is a schematic sectional view showing the configuration of a display device in the present embodiment. As shown in FIG. 1, the display device 1 includes an active matrix substrate 10 and a counter substrate 20. Although not shown in the drawing, a liquid crystal layer is disposed between the active matrix substrate 10 and the counter substrate 20. In addition, a pair of polarizing plates are disposed so as to interpose the active matrix substrate 10 and the counter substrate 20, and a backlight is disposed on the back surface (negative direction of the Z-axis) of the active matrix substrate 10. The configuration of the display device 1 will be specifically described below.

Figure 2:
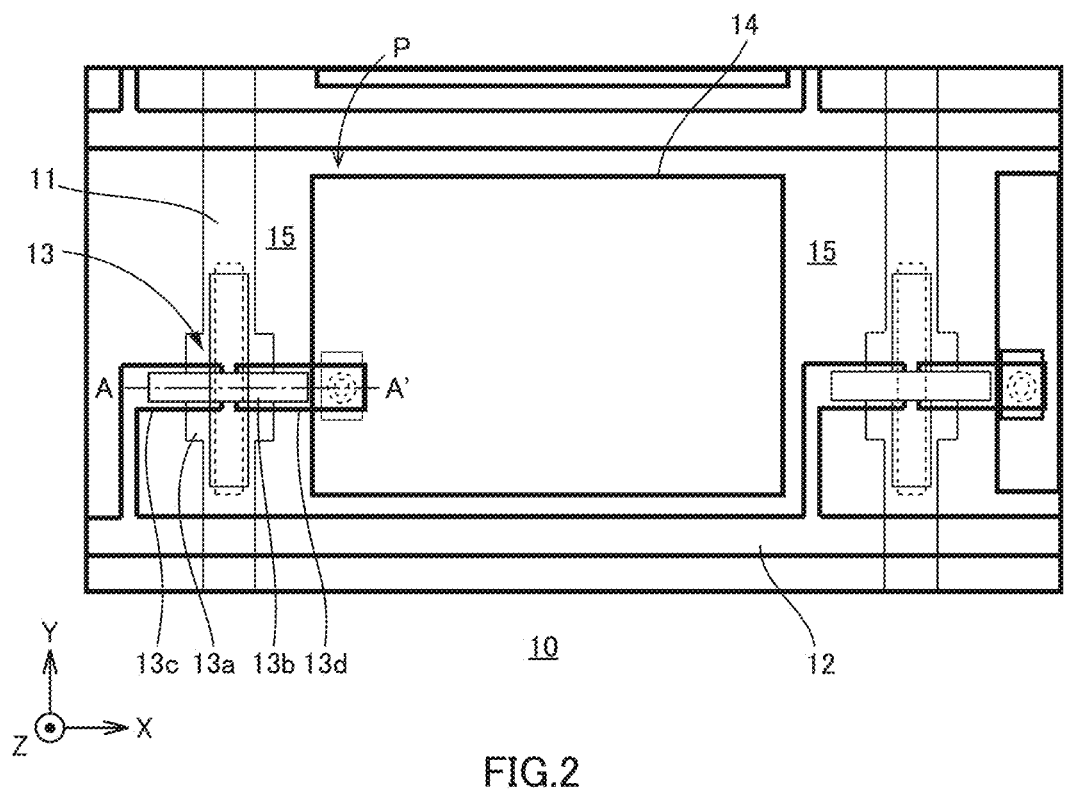
FIG. 2 is a magnified portion of the plan view of the active matrix substrate shown in FIG. 1.

FIG. 2 is a schematic plan view showing a region of the active matrix substrate 10. The active matrix substrate 10 has a plurality of gate lines 11 and a plurality of data lines 12 intersecting the plurality of gate lines 11 and includes a plurality of pixels P demarcated by the gate lines 11 and the data lines 12.

In each pixel P, a TFT 13 connected to the gate line 11 and the data line 12 of the pixel P, a pixel electrode 14 connected to the TFT 13, and a common electrode 15 are disposed.

The TFT 13 includes a gate electrode 13a, a semiconductor film 13b, a source electrode 13c, and a drain electrode 13d. The pixel electrode 14 and the common electrode 15 overlap one another with an insulating film (not shown in the drawing) interposed therebetween.

Figure 3:
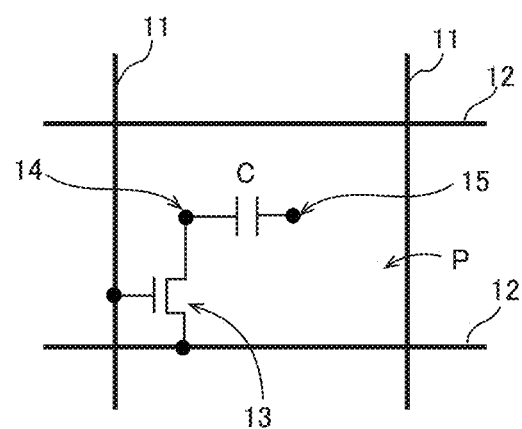
FIG. 3 is an equivalent circuit diagram of a pixel of the active matrix substrate shown in FIG. 2.

In this regard, FIG. 3 shows an equivalent circuit diagram of a pixel. As shown in FIG. 3, the gate electrode 13a of the TFT 13 is connected to the gate line 11 of the pixel P, the source electrode 13c of the TFT 13 is connected to the data line 12, and the pixel electrode 14 is connected to the drain electrode of the TFT 13. Liquid crystal capacitance C is formed between the pixel electrode 14 and the common electrode 15. The liquid crystal capacitance C is changed in accordance with the voltage applied to the pixel electrode 14, and the arrangement of the liquid crystal molecules in the liquid crystal layer (not shown in the drawing) is changed. In the present embodiment, the arrangement of liquid crystal molecules is controlled by a lateral electric field formed between the pixel electrode 14 and the common electrode 15.

Although not shown in the drawing, the active matrix substrate 10 is provided with a gate line drive circuit to scan the plurality of gate lines 11, a data line drive circuit to apply a grayscale voltage in accordance with a display image to the plurality of data lines 12, a control circuit to apply a predetermined voltage to the common electrode 15, and the like. The gate line 11 is scanned by the drive circuit, and the TFT 13 connected to the gate line 11 is switched to an on-state. Subsequently, a grayscale voltage is applied to the data line 12 by the data line drive circuit, and the grayscale voltage is applied to the pixel electrode 14 through the TFT 13. A predetermined voltage is applied to the common electrode 15 from the control circuit. The liquid crystal capacitance C of each pixel P is changed in accordance with the grayscale voltage, and an image is displayed by the pixels P in accordance with the liquid crystal capacitance C.

Meanwhile, the counter substrate 20 is provided with a plurality of color filters (not shown in the drawing) corresponding to respective colors of, for example, R (red), G (green), and B (blue). The color filters are disposed so as to have a one-to-one correspondence with the pixels P. The color filters are arranged in the order of, for example, R, G, B, R, G, B, . . . in the extension direction of the gate line 11. In addition, the counter substrate 20 is provided with a black matrix (not shown in the drawing) between adjacent color filters to block the light.

Figure 4A:
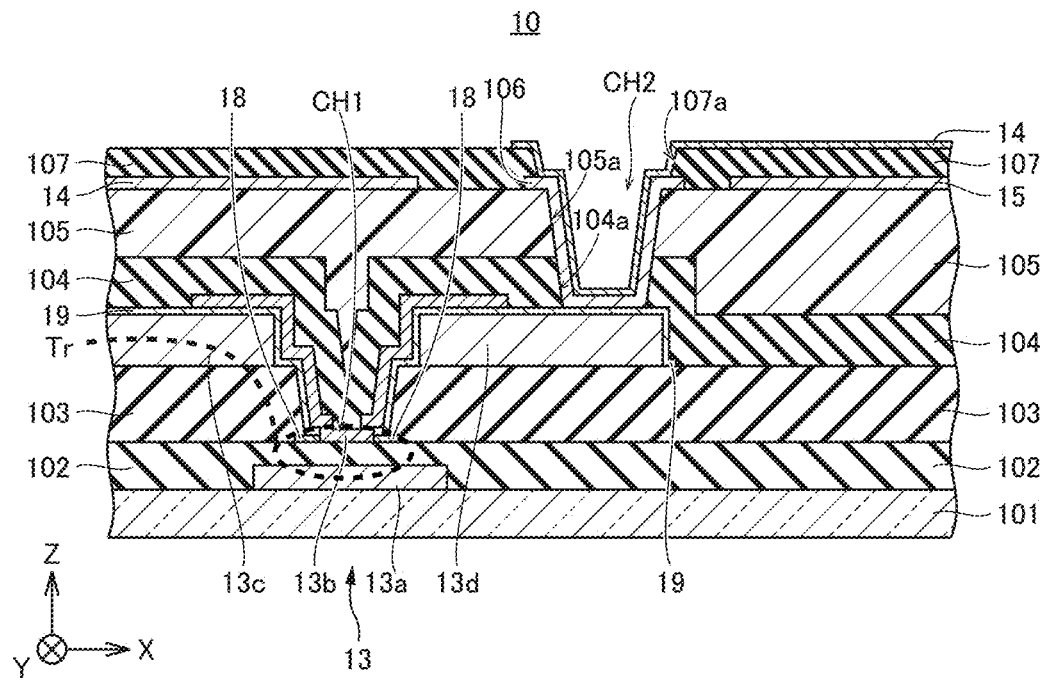
FIG. 4A is a sectional view cut along line IVA-IVA of the active matrix substrate shown in FIG. 2.

Next, the configuration of the pixel P of the active matrix substrate 10 will be specifically described. FIG. 4A is a sectional view cut along line A-A' in FIG. 2. Meanwhile, FIG. 4B is a magnified portion demarcated by broken line S of the sectional view shown in FIG. 4A.

As shown in FIG. 4A, the gate electrode 13a is disposed on a substrate 101 of the active matrix substrate 10. The substrate 101 is a transparent substrate of glass or the like having insulation performance. In the gate electrode 13a, for example, a metal film formed of aluminum (Al) serving as a lower layer and a metal film formed of molybdenum (Mo) serving as an upper layer are stacked. The metal films of molybdenum (Mo) and aluminum (Al) have a film thickness of, for example, about 100 nm and about 200 nm, respectively. In this regard, the configuration and the thickness of the gate electrode 13a are not limited to the above.

The gate electrode 13a is covered by a gate insulating film 102. In this example, in the gate insulating film 102, for example, an inorganic insulating film formed of silicon nitride (SiNx) serving as a lower layer and an inorganic insulating film formed of silicon oxide ($SiO_2$) serving as an upper layer are stacked. The inorganic insulating films of silicon oxide (SiO$_2$) and silicon nitride (SiNx) have a film thickness of, for example, about 50 nm and about 350 nm, respectively. In this regard, the configuration of the gate insulating film 102 is not limited. For example, in the gate insulating film 102, silicon nitride (SiNx) may be disposed as the upper layer, and silicon oxide (SiO$_2$) may be disposed as the lower layer. Meanwhile, the gate insulating film 102 is not limited to having the above-described stacking structure and may be composed of a single-layer inorganic insulating film formed of silicon nitride (SiNx) or silicon oxide (SiO$_2$).

Figure 4B:
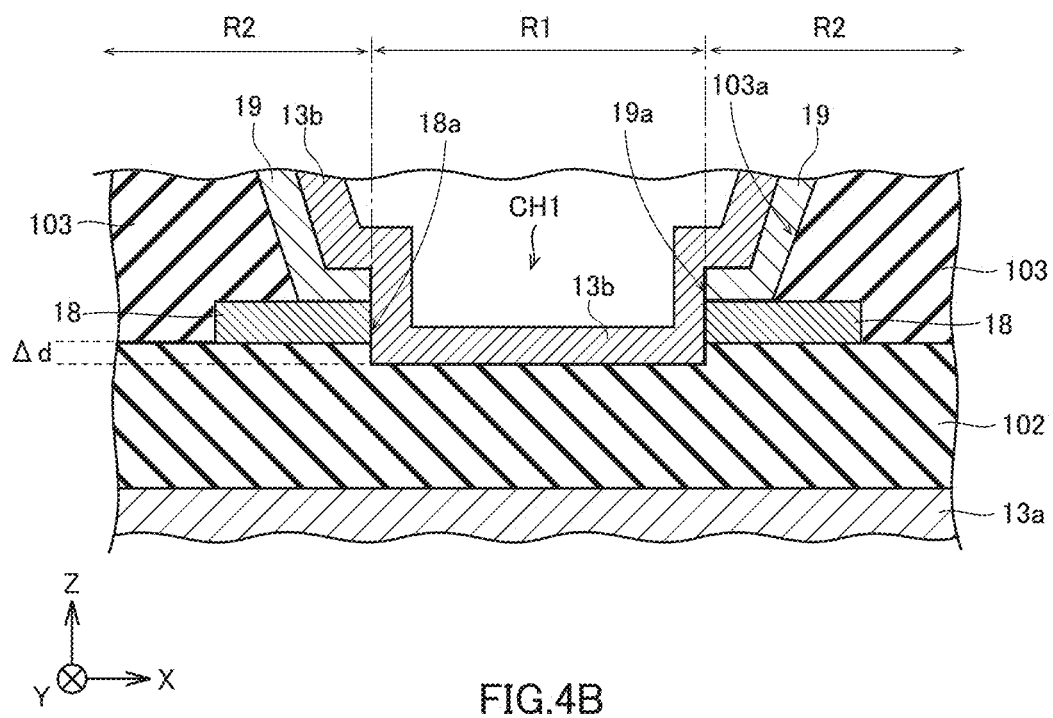
FIG. 4B is a magnified portion demarcated by broken line in the sectional view shown in FIG. 4A and is a diagram illustrating the film thickness of a gate insulating film.

Meanwhile, as shown in FIG. 4B, regarding the gate insulating film 102, the upper surface (surface in the positive direction of the Z-axis) in the region corresponding to the channel region of the TFT 13, that is, in the region overlapping a contact hole CH1 in plan view (hereafter referred to as a first region R1), is lower than the upper surface in the region other than the first region R1 (hereafter referred to as a second region R2) by Δd. In other words, the first region R1 of the gate insulating film 102 is recessed from the upper surface in the second region R2 by a distance of Δd. Alternatively, regarding the upper surface of the gate insulating film 102, a difference in height exists between the first region R1 and the second region R2 such that the upper surface of the gate insulating film 102 in the first region R1 is lower than the upper surface in the second region R2 by Δd in the negative direction of the Z-axis.

A protective film 18 serving as an etching-stopper layer and an opening 18a at a position overlapping the gate electrode 13a in plan view are formed on the gate electrode 13a with the gate insulating film 102 interposed therebetween. The protective film 18 is composed of, for example, molybdenum nitride (MoN) or molybdenum (Mo) and has a film thickness of about 100 nm. In this regard, the configuration of the protective film 18 is not limited, and it is favorable to use a material having etching resistance to an acid aqueous solution containing fluorine, for example, a hydrofluoric acid aqueous solution or an ammonium fluoride aqueous solution.

As shown in FIG. 4A and FIG. 4B, part of each of the gate insulating film 102 and the protective film 18 is covered by an inorganic insulating film 103. As shown in FIG. 4B, the inorganic insulating film 103 overlaps the upper surface of each of two protective films 18 disposed at a distance from each other and has an opening 103a with a greater opening width than the opening 18a. The inorganic insulating film 103 is composed of an inorganic insulating film formed of, for example, silicon nitride (SiNx), and has a film thickness of about 400 nm. In this regard, the configuration of the inorganic insulating film 103 is not limited to the above. The inorganic insulating film 103 may be an inorganic insulating film formed of silicon oxide (SiO$_2$) or may have a stacking structure in which silicon oxide (SiO$_2$) is disposed as the upper layer and silicon nitride (SiNx) is disposed as the lower layer or a stacking structure in which silicon nitride (SiNx) is disposed as the upper layer and silicon oxide (SiO$_2$) is disposed as the lower layer.

As shown in FIG. 4A, the source electrode 13c and the drain electrode 13d are disposed on the inorganic insulating film 103 so as to interpose the contact hole CH1 in plan view. In each of the source electrode 13c and the drain electrode 13d, for example, a metal film formed of titanium (Ti), a metal film formed of aluminum (Al), and a metal film formed of titanium (Ti) are successively stacked. The film thickness of the metal films is about 50 nm, about 300 nm, and about 50 nm successively from the lower layer. In this regard, the configuration of each of the source electrode 13c and the drain electrode 13d is not limited. For example, copper (Cu) may be used in place of aluminum (Al), and molybdenum nitride (MoN) may be used in place of titanium (Ti).

The surface of each of the source electrode 13c and the drain electrode 13d, the surface of the inorganic insulating film 103 and part of the upper surface of the inorganic insulating film 103 in the opening 103a, and the upper surface of the protective film 18 are covered by the conductive film 19. As shown in FIG. 4B, the conductive film 19 has an opening 19a with substantially the same opening width as the opening 18a such that the opening 19a overlaps the opening 18a in plan view. In this example, the contact hole CH1 is composed of the opening 18a and the opening 19a. The conductive film 19 may be composed of, for example, any one metal of molybdenum nitride (MoN), molybdenum (Mo), chromium (Cr), niobium (Nb), tantalum (Ta), and tungsten (W). Alternatively, the conductive film 19 may be composed of an alloy containing these metals as primary components. The conductive film 19 has a film thickness of, for example, about 200 nm. In this regard, the configuration of the conductive film 19 is not limited, and it is favorable to use a material having etching resistance to an acid aqueous solution containing fluorine, for example, a hydrofluoric acid aqueous solution or an ammonium fluoride aqueous solution.

In the present embodiment, the example in which the opening width of the opening 18a is equal to the opening width of the opening 19a is shown. However, the opening width of the opening 19a may be greater than the opening width of the opening 18a. That is, the opening 18a and the opening 19a may be formed such that the cross-sectional shape of the contact hole CH1 composed of the opening 18a and the opening 19a has a reverse tapered shape.

As shown in FIG. 4A and FIG. 4B, the semiconductor film 13b is disposed on the conductive film 19. The semiconductor film 13b overlaps the source electrode 13c, drain electrode 13d, and the gate electrode 13a in plan view and is in contact with the gate insulating film 102 in the contact hole CH1. The semiconductor film 13b is composed of, for example, an amorphous oxide semiconductor containing indium (In), gallium (Ga), and zinc (Zn) in a predetermined ratio and has a film thickness of about 70 nm. In this regard, the configuration of the semiconductor film 13b is not limited. The semiconductor film 13b may be composed of, for example, InGaO$_3$(ZnO)$_5$, magnesium zinc oxide (Mg$_x$Zn$_{1-x}$O), cadmium zinc oxide (Cd$_x$Zn$_{1-x}$O), cadmium oxide (CdO), or an amorphous oxide semiconductor containing indium (In), gallium (Ga), and zinc (Zn) in a predetermined ratio.

The surfaces of the inorganic insulating film 103 and the semiconductor film 13b and part of the conductive film 19 are covered by the inorganic insulating film 104. The inorganic insulating film 104 has an opening 104a on the conductive film 19 that overlaps the drain electrode 13d in plan view. The inorganic insulating film 104 is composed of, for example, silicon oxide (SiO$_2$) and has a film thickness of about 270 nm. In this regard, the configuration of the inorganic insulating film 104 is not limited.

An organic insulating film 105 is disposed on the inorganic insulating film 104. The organic insulating film 105 has an opening 105a at a position overlapping the opening 104a in plan view. A contact hole CH2 is composed of the opening 104a and the opening 105a. The organic insulating film 105 is composed of, for example, an organic transparent resin such as an acrylic resin or a siloxane-based resin and has a film thickness of about 2.0 μm.

The common electrode 15 and a transparent conductive film 106 are disposed on the organic insulating film 105. The common electrode 15 is arranged outside the contact hole CH2 in plan view. The transparent conductive film 106 covers part of the upper surface of the organic insulating film 105 and covers the organic insulating film 105, the inorganic insulating film 104, and the conductive film 19 in the contact hole CH2. Each of the transparent conductive film 106 and the common electrode 15 is composed of, for example, ITO (indium tin oxide) or IZO (indium zinc oxide) and has a film thickness of about 70 nm.

The surface of the common electrode 15 and part of the surface of the transparent conductive film 106 are covered by an inorganic insulating film 107. The inorganic insulating film 107 has an opening 107a with a larger opening width than the contact hole CH2 at a position overlapping the contact hole CH2 in plan view. The inorganic insulating film 107 is composed of, for example, silicon nitride (SiNx) or silicon oxide (SiO$_2$) and has a film thickness of about 300 nm.

The pixel electrode 14 is disposed on the inorganic insulating film 107. The pixel electrode 14 covers the transparent conductive film 106 in the opening 107a and overlaps one common electrode 15 with the inorganic insulating film 107 interposed therebetween. That is, the pixel electrode 14 is connected to the drain electrode 13d through the transparent conductive film 106 and the conductive film 19. The pixel electrode 14 is composed of, for example, ITO or IZO and has a film thickness of about 70 nm.

The structure of the pixel P of the active matrix substrate 10 according to the present embodiment is as described above. As shown in FIG. 4B, in the present embodiment, regarding the gate insulating film 102, the position of the upper surface (in the positive direction of the Z-axis) in the first region R1 is lower than the position of the upper surface (in the positive direction of the Z-axis) in the second region R2 by Δd. Consequently, regarding the gate insulating film 102, the film thickness of the gate insulating film 102 in the first region R1 corresponding to the channel region of the TFT 13 is small compared with the case in which the upper surface of the gate insulating film 102 in the first region R1 is at a substantially equal height to the upper surface in the second region R2. As the film thickness of the gate insulating film 102 in the first region R1 decreases, the distance between the gate electrode 13a and the semiconductor film 13b is reduced. As a result, the electric field strength during conduction of the TFT 13 is enhanced, and the on-current of the TFT 13 is increased. Meanwhile, the inorganic insulating film 103 and the gate insulating film 102 in the second region R2 are disposed between the source electrode 13c and the gate electrode 13a and between the drain electrode 13d and the gate electrode 13a. The surface of the gate insulating film 102 in the second region R2 is not etched by the cleaning treatment of the gate insulating film 102. Consequently, the electrostatic withstand voltage between the source electrode 13c and the gate electrode 13a and the electrostatic withstand voltage between the drain electrode 13d and the gate electrode 13a are ensured, and electrostatic breakdown of the TFT 13 can be suppressed.

Next, a method for manufacturing the active matrix substrate 10 will be described. After the gate electrode 13a is formed on the substrate 101 by using a known method, films of silicon nitride (SiNx) and silicon oxide (SiO$_2$) are successively formed above the gate electrode 13a by using, for example, a plasma CVD (chemical vapor deposition) method so as to form the gate insulating film 102 (refer to FIG. 5A).

A metal film is formed of molybdenum nitride (MoN) by using, for example, a sputtering method. The metal film is patterned by using photolithography and dry etching. In this manner, the protective film 18 is formed above the gate electrode 13a (refer to FIG. 5B).

Figure 5A:
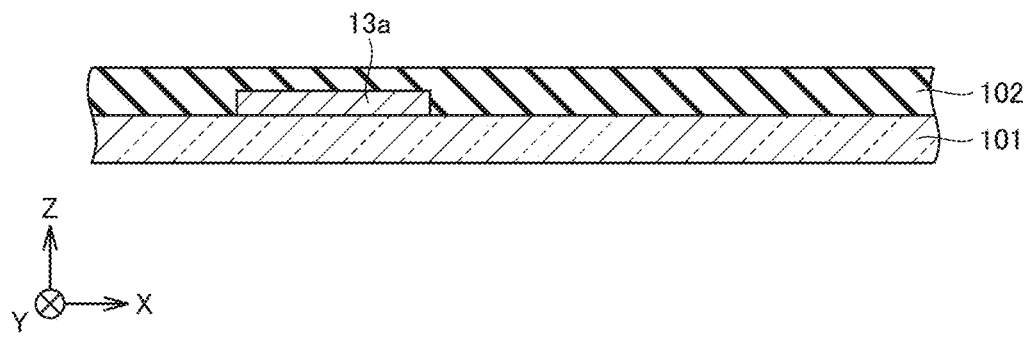
FIG. 5A is a sectional view showing a production step of the active matrix substrate shown in FIG. 4A and is a sectional view showing a step of forming a gate electrode and a gate insulating film on a substrate.
Figure 5B:
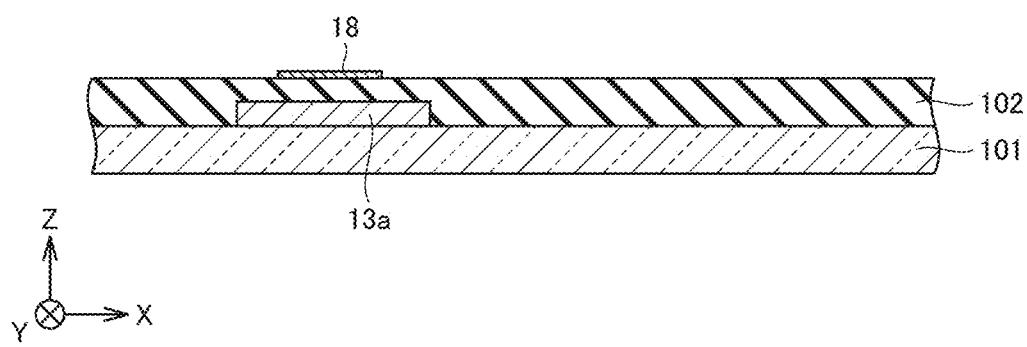
FIG. 5B is a sectional view showing a step of forming a protective film on the gate insulating film after the step shown in FIG. 5A.
Figure 5C:
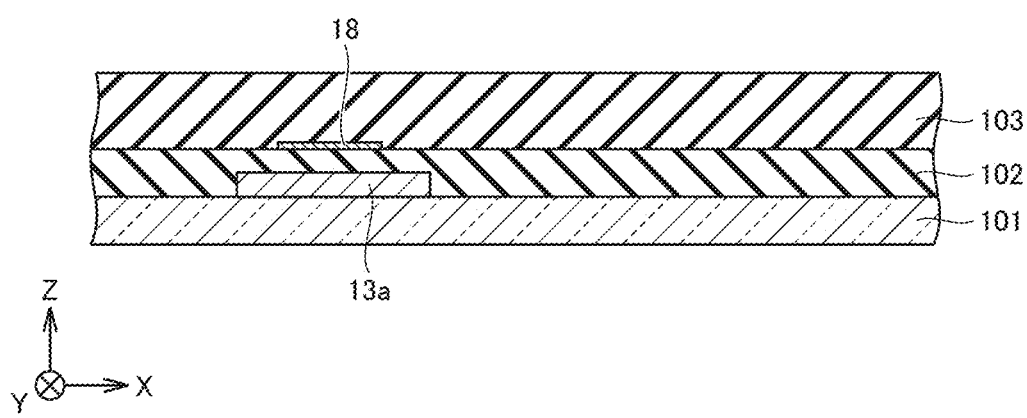
FIG. 5C is a sectional view showing a step of forming an inorganic insulating film that covers the protective film after the step shown in FIG. 5B.

Thereafter, the inorganic insulating film 103 is formed of silicon nitride (SiNx) above the protective film 18 by using, for example, a plasma CVD method (refer to FIG. 5C).

Films of titanium (Ti), aluminum (Al), and titanium (Ti) are successively formed on the inorganic insulating film 103 by, for example, a sputtering method so as to form a source-drain film serving as the source electrode 13c and the drain electrode 13d. The source-drain film is patterned by using photolithography and dry etching. In this manner, the source electrode 13c and the drain electrode 13d that overlap the gate electrode 13a in plan view are formed (refer to FIG. 5D).

Figure 5D:
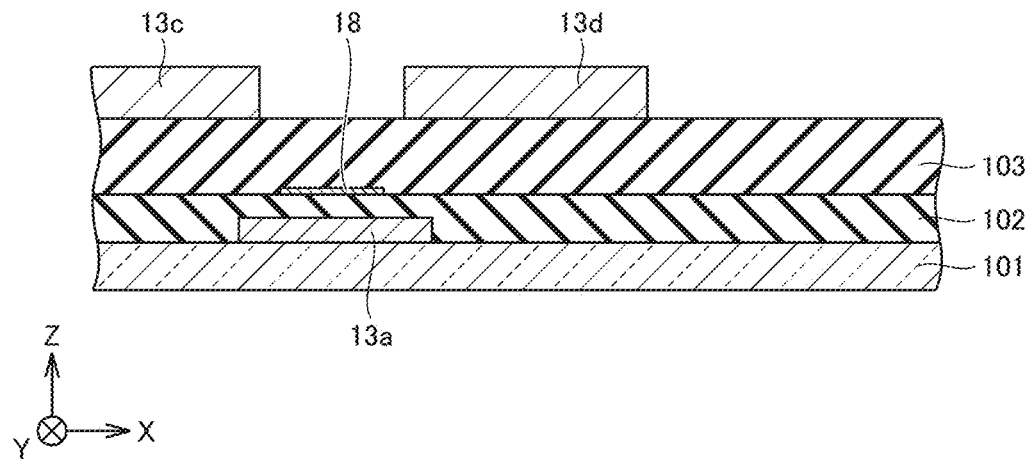
FIG. 5D is a sectional view showing a step of forming a source electrode and a drain electrode on the inorganic insulating film after the step shown in FIG. 5C.
Figure 5E:
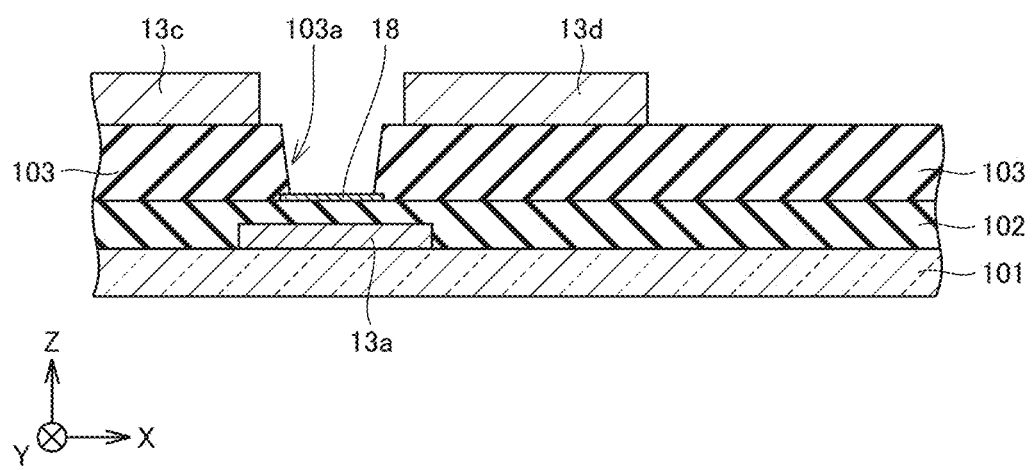
FIG. 5E is a sectional view showing a step of forming an opening of the inorganic insulating film after the step shown in FIG. 5D.

The inorganic insulating film 103 is patterned by performing photolithography and dry etching so as to form the opening 103a of the inorganic insulating film 103 at the position overlapping the gate electrode 13a in plan view, that is, on the protective film 18 (refer to FIG. 5E). The protective film 18 exhibits a lower etching rate than the inorganic insulating film 103 during etching when the opening 103a is formed and, therefore, functions as an etching stopper. As a result, the portion overlapping the gate electrode 13a in plan view of the gate insulating film 102 is not etched so as to be protected.

A metal film serving as the conductive film 19 is formed of molybdenum (Mo) above the source electrode 13c and the drain electrode 13d by using, for example, a sputtering method. The metal film formed of molybdenum (Mo) is patterned by performing photolithography and dry etching. At this time, the protective film 18 in the opening 103a is also etched together with the metal film formed of molybdenum (Mo). In this manner, the conductive film 19 and the contact hole CH1 composed of the opening 18a and the opening 19a are formed (refer to FIG. 5F).

The surface of the gate insulating film 102 is subjected to cleaning treatment by using hydrofluoric acid. Consequently, the surface of the gate insulating film 102 is etched. As a result, as shown in FIG. 4B, the position of the upper surface (in the positive direction of the Z-axis) of the gate insulating film 102 in the first region R1 is made to be lower than the position of the upper surface (in the positive direction of the Z-axis) of the gate insulating film 102 in the second region R2.

In this regard, although the conductive film 19 is exposed to hydrofluoric acid during cleaning treatment, the conductive film 19 has resistance to the hydrofluoric acid and, therefore, is not etched during the cleaning treatment. Consequently, the surfaces of the source electrode 13c and the drain electrode 13d are not damaged by the cleaning treatment.

A film of an oxide semiconductor containing In—Ga—Zn—O is formed above the conductive film 19 by using, for example, a plasma CVD method, and the oxide semiconductor is patterned by performing photolithography and dry etching. Consequently, the semiconductor film 13b in contact with the gate insulating film 102 in the contact hole CH1 is formed so as to produce the TFT 13 (refer to FIG. 5G). The surface of the gate insulating film 102 in the contact hole CH1 is cleaned before the semiconductor film 13b is formed. Consequently, the defect level at the semiconductor 13b interface of the TFT 13 is reduced compared with the case in which the cleaning treatment is not performed, and the performance of the TFT 13 is improved.

Figure 5F:
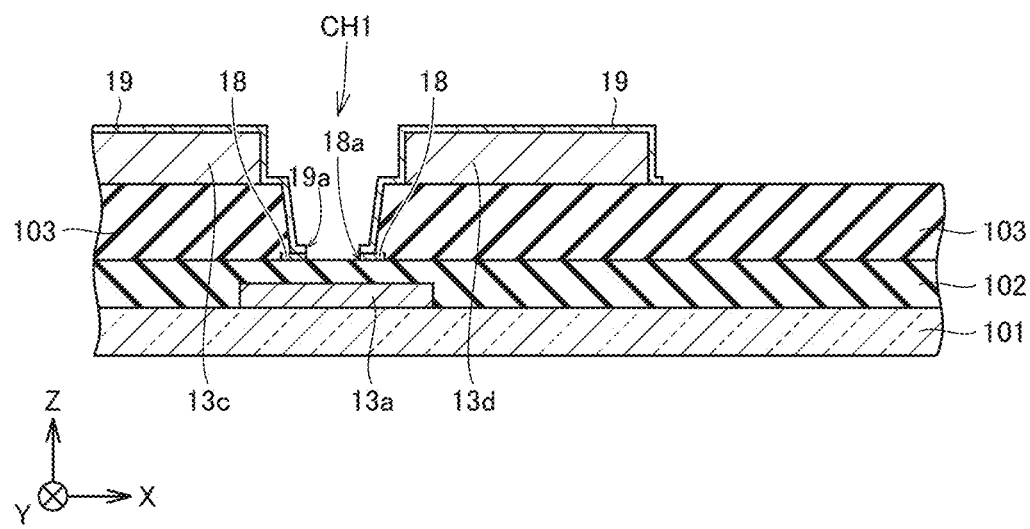
FIG. 5F is a sectional view showing a step of forming a conductive film that covers the source electrode and the drain electrode after the step shown in FIG. 5E.
Figure 5G:
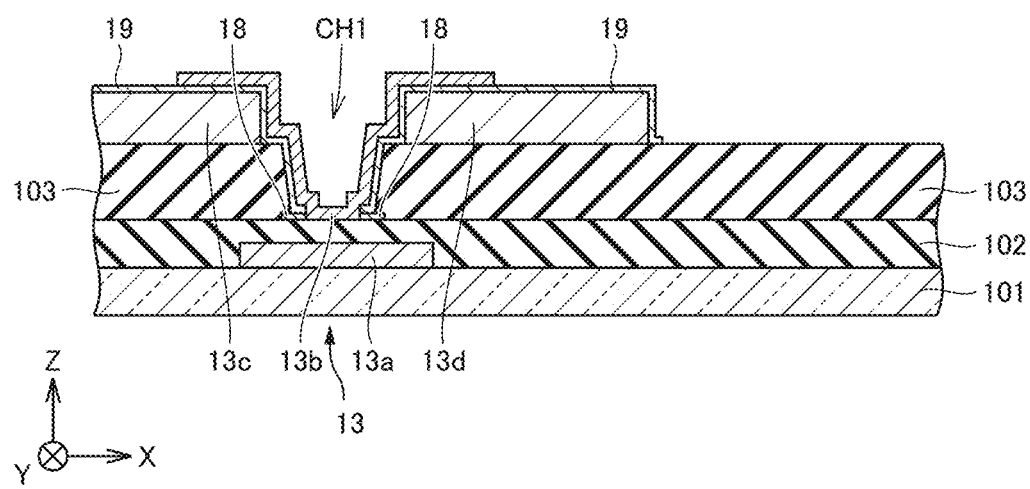
FIG. 5G is a sectional view showing a step of forming a semiconductor film after the step shown in FIG. 5F.
Figure 5H:
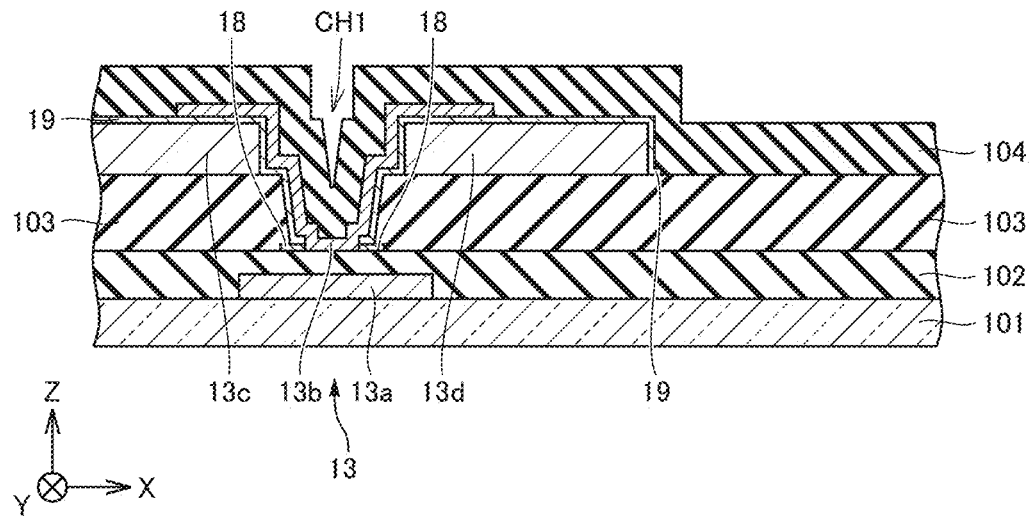
FIG. 5H is a sectional view showing a step of forming an inorganic insulating film that covers the semiconductor film after the step shown in FIG. 5G.

Thereafter, the inorganic insulating film 104 is formed of silicon nitride (SiNx) above the semiconductor film 13b by using, for example, a plasms CVD method (refer to FIG. 5H).

Figure 5I:
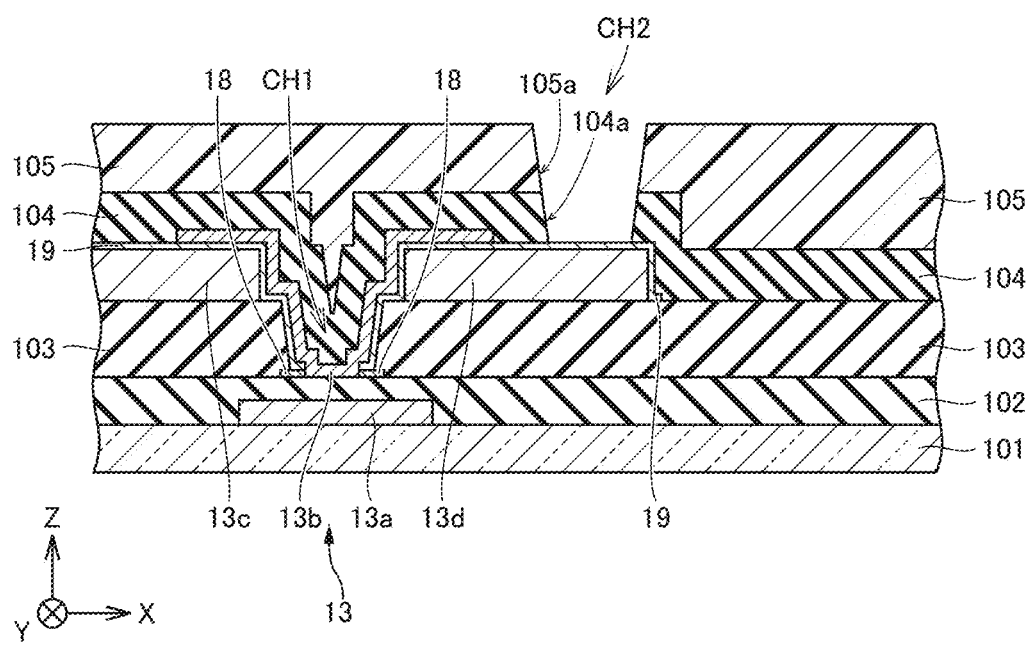
FIG. 5I is a sectional view showing a step of forming an organic insulating film and, thereafter, forming a contact hole on the drain electrode after the step shown in FIG. 5H.

The inorganic insulating film 104 is patterned by performing photolithography and dry etching so as to form the opening 104a at the position overlapping the drain electrode 13d in plan view. The organic insulating film 105 is formed of an acrylic resin or a siloxane-based resin on the inorganic insulating film 104 by performing photolithography (refer to FIG. 5I). In this manner, the opening 105a of the organic insulating film 105 is formed so as to overlap the opening 104a in plan view and to form the contact hole CH2 composed of the opening 104a and the opening 105a.

Figure 5J:
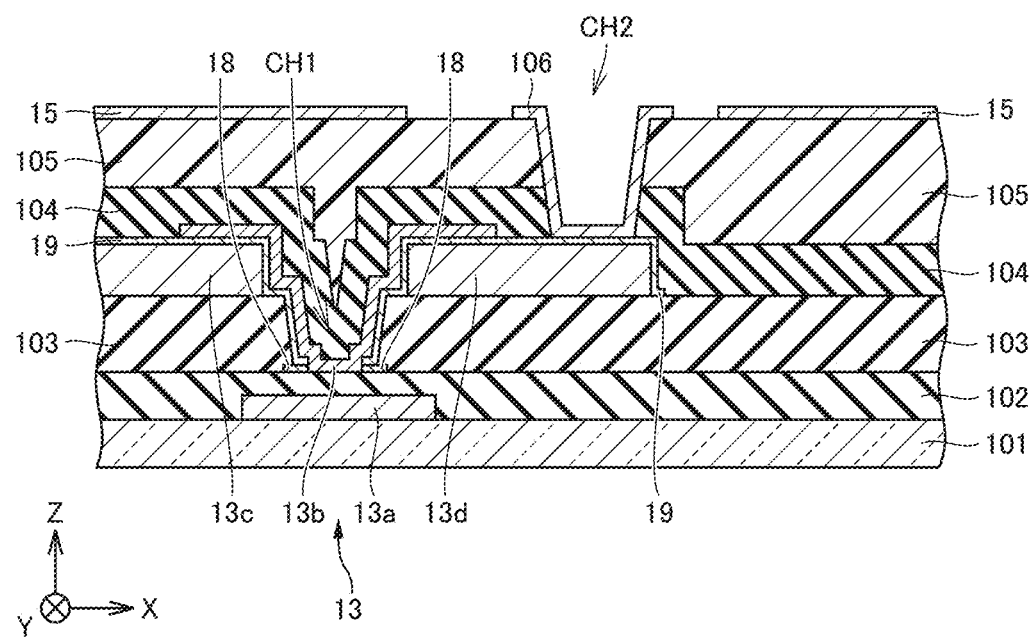
FIG. 5J is a sectional view showing a step of forming a common electrode and a transparent conductive film after the step shown in FIG. 5I.

The transparent conductive film is formed of ITO above the organic insulating film 105 by using a sputtering method, and the transparent conductive film is patterned by performing photolithography and dry etching. In this manner, the transparent conductive film 106 connected to the conductive film 19 in the contact hole CH2 is formed and the common electrode 15 is formed in the region not overlapping the contact hole CH2 in plan view (refer to FIG. 5J).

Figure 5K:
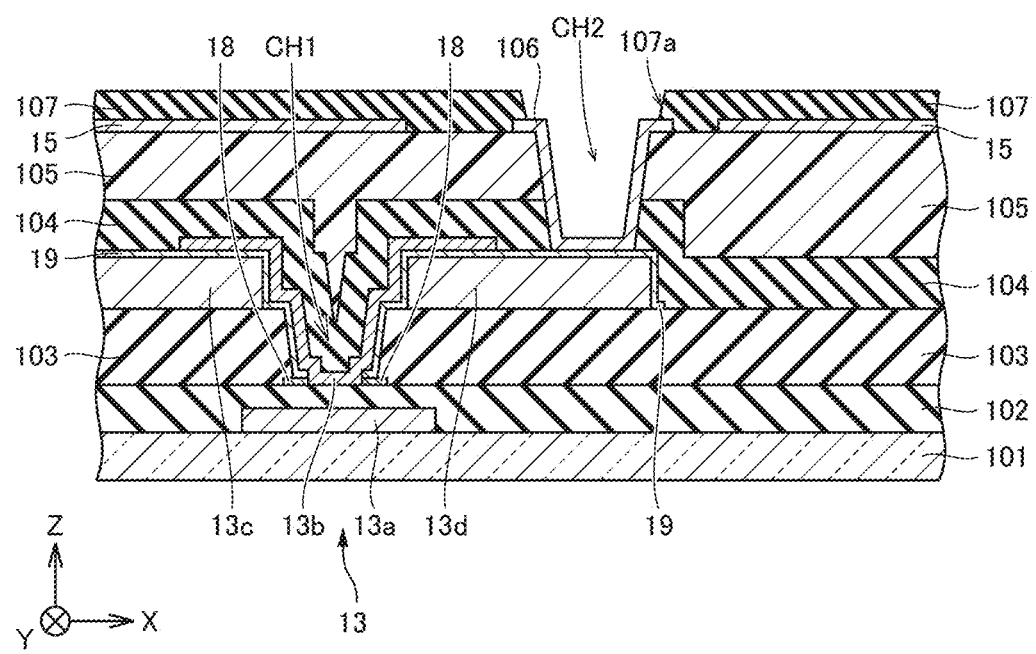
FIG. 5K is a sectional view showing a step of forming an inorganic insulating film that covers the common electrode after the step shown in FIG. 5J.

The inorganic insulating film is formed of silicon nitride (SiNx) above the common electrode 15 and the transparent conductive film 106 by using, for example, a plasma CVD method, and the inorganic insulating film is patterned by performing photolithography and dry etching. In this manner, the inorganic insulating film 107 having the opening 107a on the transparent conductive film 106 is formed (refer to FIG. 5K).

Figure 5L:
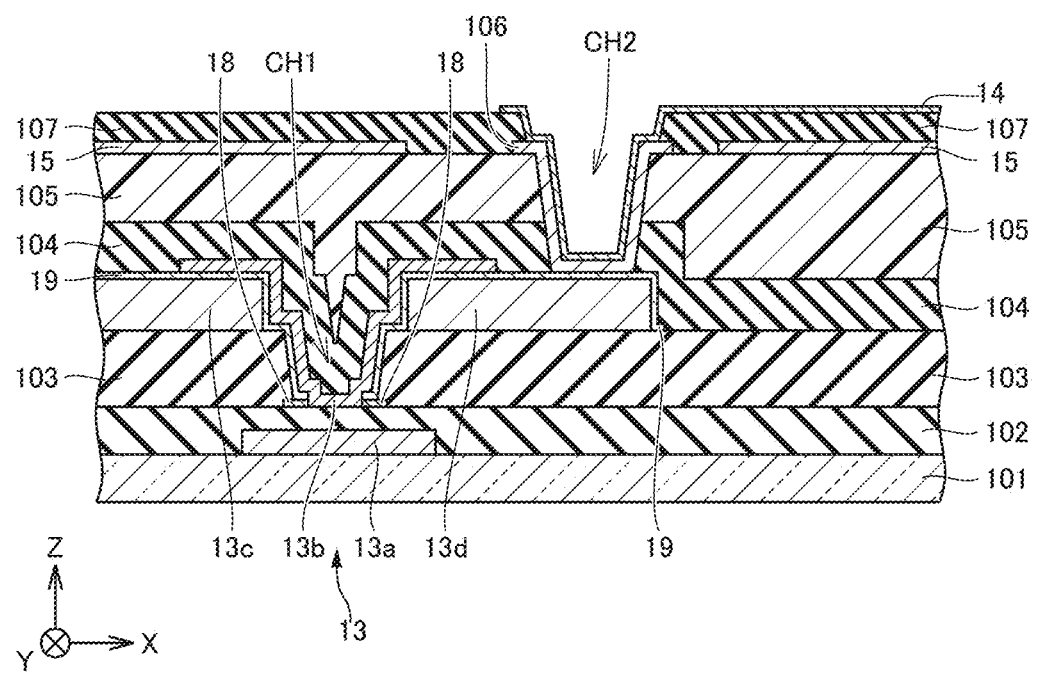
FIG. 5L is a sectional view showing a step of forming a pixel electrode after the step shown in FIG. 5K.

The transparent conductive film is formed of ITO above the inorganic insulating film 107 by using a sputtering method, and the transparent conductive film is patterned by performing photolithography and dry etching (refer to FIG. 5L). In this manner, the pixel electrode 14 covering the surface of the transparent conductive film 106 in the contact hole CH2 and overlapping the common electrode 15 with the inorganic insulating film 107 interposed therebetween is formed so as to produce the active matrix substrate 10.

As described above, in the first embodiment, by the cleaning treatment using hydrofluoric acid, dust and the like on the surface of the gate insulating film 102 are removed and, in addition, regarding the gate insulating film 102, the upper surface of the portion corresponding to the channel region of the TFT 13 (first region R1) is made to be lower than the upper surface of the portion overlapping each of the source electrode 13c and the drain electrode 13d (second region R2). That is, the film thickness of the gate insulating film 102 in the first region R1 is smaller than the film thickness before the gate insulating film 102 is subjected to the cleaning treatment. As a result, the distance between the semiconductor film 13b and the gate electrode 13a in the TFT 13 is reduced, and the on-current of the TFT 13 is increased. Meanwhile, the film thickness of the gate insulating film 102 in the second region R2 does not change between before and after the cleaning treatment. Consequently, the electrostatic withstand voltage is ensured by the gate insulating film 102 and the inorganic insulating film 103 between the source electrode 13c and the gate electrode 13a and between the drain electrode 13d and the gate electrode 13a, and electrostatic breakdown of the TFT 13 does not readily occur.

Second Embodiment

Figure 6:
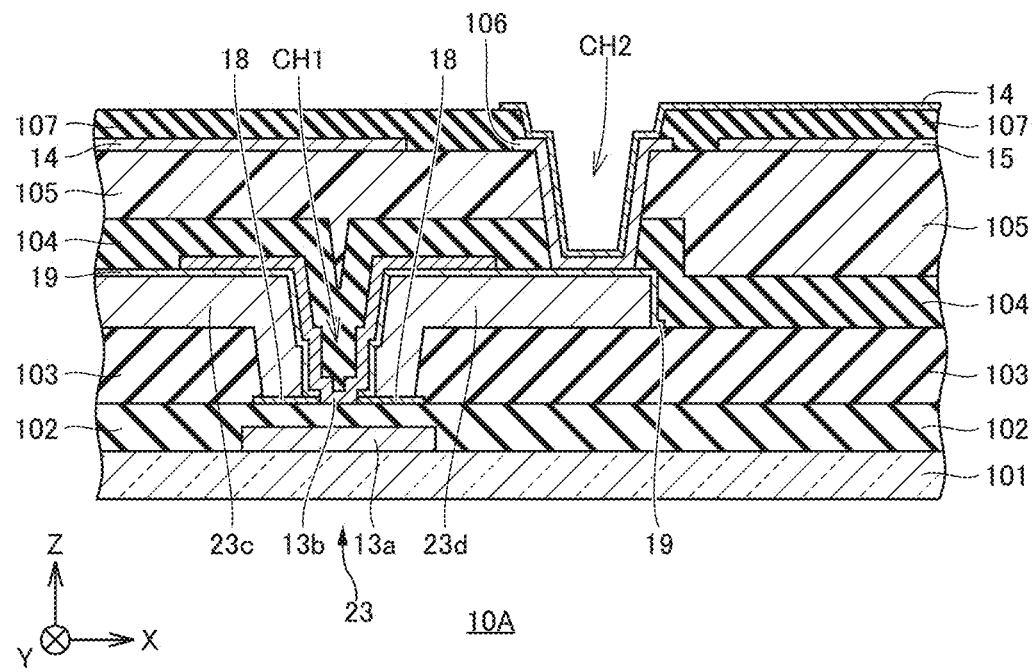
FIG. 6 is a sectional view of a pixel of an active matrix substrate in a second embodiment.

In the present embodiment, a TFT having a structure different from the structure of the TFT 13 according to the first embodiment will be described. FIG. 6 is a sectional view showing the structure of a pixel P of an active matrix substrate according to the present embodiment. The same configurations as those in the first embodiment are indicated by the same references as in the first embodiment. Configurations different from those in the first embodiment will be described below.

As shown in FIG. 6, the active matrix substrate 10A is provided with a TFT 23. The TFT 23 includes a source electrode 23c and a drain electrode 23d. The source electrode 23c and the drain electrode 23d are composed of the same materials as for the source electrode 13c and the drain electrode 13d, respectively, in the first embodiment but have different shapes from the shapes of the source electrode 13c and the drain electrode 13d, respectively. Specifically, each of the source electrode 23c and the drain electrode 23d covers not only part of the upper surface of the inorganic insulating film 103 but also the surface of the inorganic insulating film 103 in the opening 103a. That is, the present embodiment is different from the first embodiment in that the source electrode 23c and the drain electrode 23d are disposed inside the opening 103a.

In this regard, although not shown in the drawing, the position of the upper surface (in the positive direction of the Z-axis) of the gate insulating film 102 in the first region R1 is lower than the upper surface in the second region R2 in the same manner as shown in FIG. 4B above. Consequently, the on-current of the TFT 23 is increased compared with the case in which the upper surface (in the positive direction of the Z-axis) of the gate insulating film 102 in the first region R1 is substantially equal to the position of the upper surface in the second region R2. Meanwhile, since the upper surface of the gate insulating film 102 in the second region R2 is higher than the upper surface in the first region R1, the electrostatic withstand voltage is ensured by the gate insulating film 102 and the inorganic insulating film 103 between the gate electrode 13a and the source electrode 23c and between the gate electrode 13a and the drain electrode 23d, and electrostatic breakdown of the TFT 23 does not readily occur.

The active matrix substrate 10A according to the present embodiment may be produced as described below. The same steps as the steps shown in FIG. 5A and FIG. 5B above are performed so as to form the protective film 18 on the gate insulating film 102. In this regard, the width of the protective film 18 in the X-axis direction is smaller than the width of the gate electrode 13a in the X-axis direction but is greater than the width of the protective film 18 in the X-axis direction in the first embodiment.

Figure 7A:
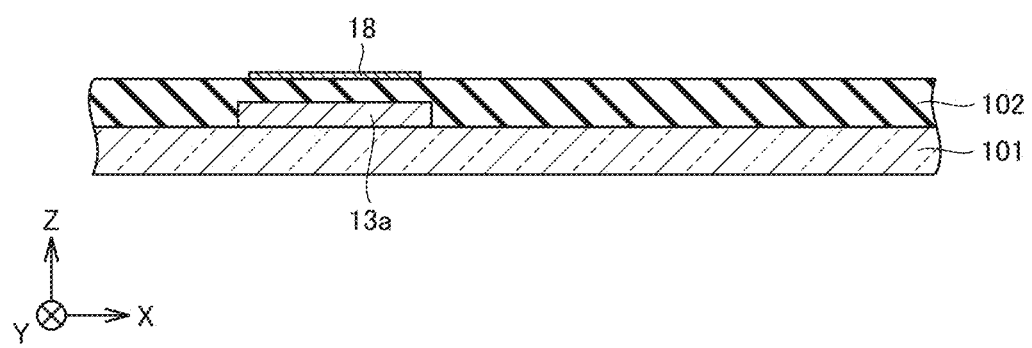
FIG. 7A is a sectional view illustrating a production step of the active matrix substrate shown in FIG. 6 and is a sectional view showing a step of forming a protective film after a gate electrode and a gate insulating film are formed.
Figure 7B:
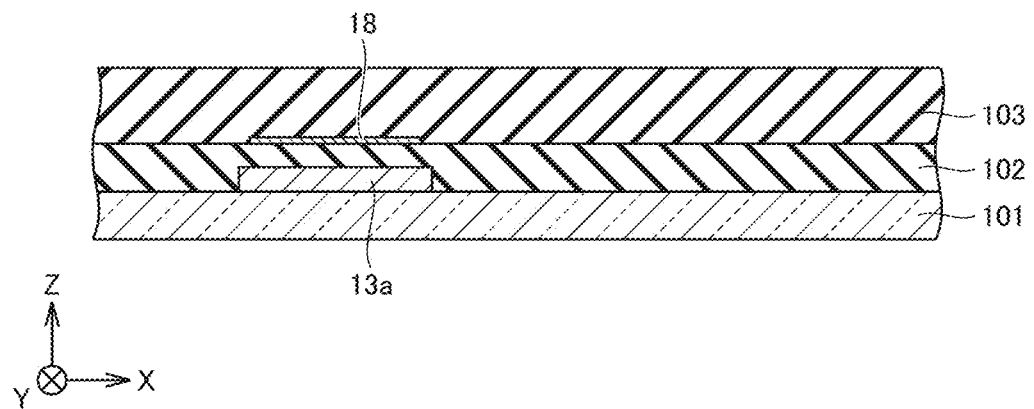
FIG. 7B is a sectional view showing a step of forming an inorganic insulating film that covers a protective film after the step shown in FIG. 7A.
Figure 7C:
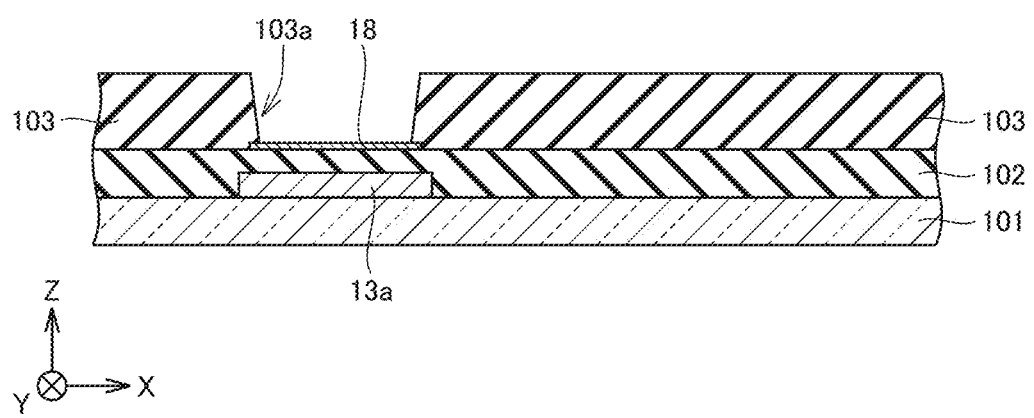
FIG. 7C is a sectional view showing a step of forming an opening of the inorganic insulating film after the step shown in FIG. 7B.

The inorganic insulating film 103 is formed above the protective film 18 by performing the same step as the step shown in FIG. 5C above (refer to FIG. 7B). Thereafter, the inorganic insulating film 103 is patterned by performing photolithography and dry etching. In this manner, the opening 103a of the inorganic insulating film 103 is formed on the protective film 18 (refer to FIG. 7C).

Figure 7D:
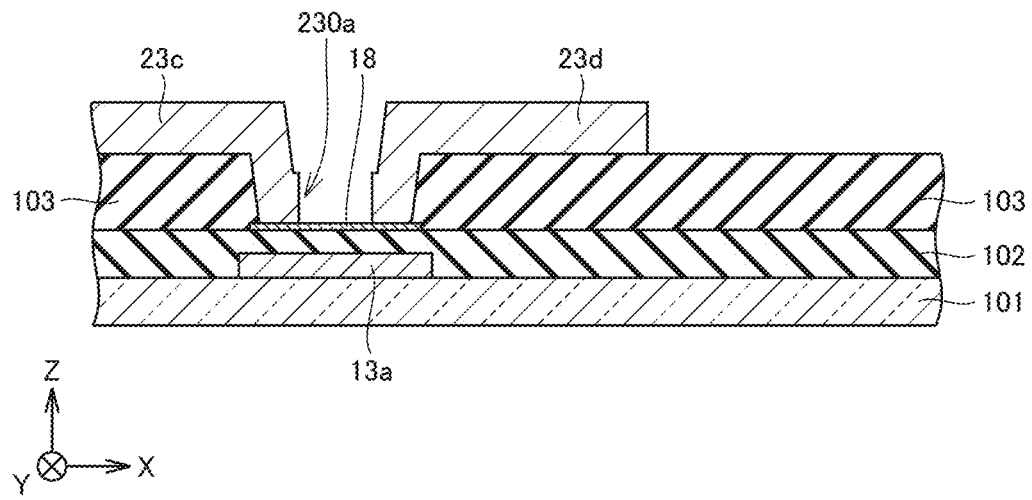
FIG. 7D is a sectional view showing a step of forming a source electrode and a drain electrode on the inorganic insulating film after the step shown in FIG. 7C.

The source electrode 23c and the drain electrode 23d are formed on the protective film 18 and the inorganic insulating film 103 by performing the same step as the step shown in FIG. 5D above so as to form an opening 230a of the source-drain film on the protective film 18 (refer to FIG. 7D).

Figure 7E:
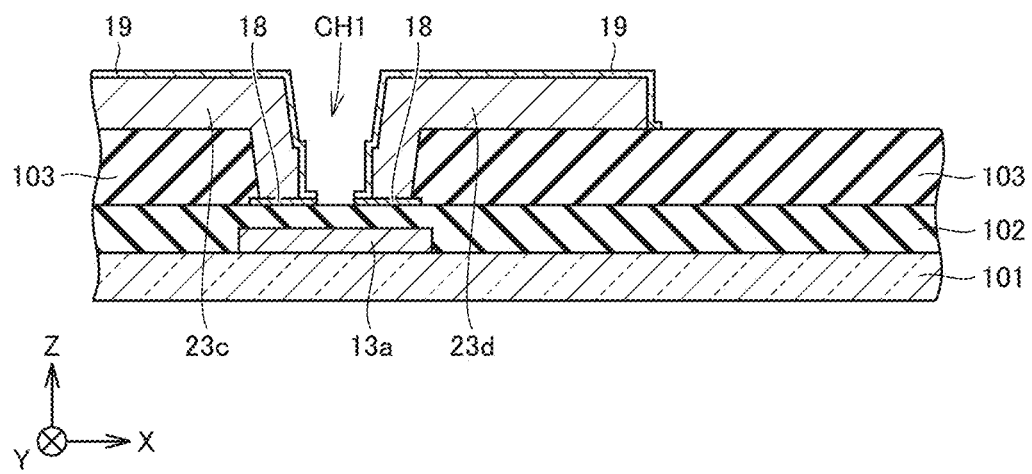
FIG. 7E is a sectional view showing a step of forming a conductive film that covers the source electrode and the drain electrode after the step shown in FIG. 7D.

The conductive film 19 covering the surfaces of the source electrode 23c and the drain electrode 23d is formed by performing the same step as the step shown in FIG. 5F above so as to form the opening 19a of the conductive film 19 and an opening of the protective film 18 (refer to FIG. 7E).

The surface of the gate insulating film 102 is subjected to cleaning treatment by using hydrofluoric acid so as to clean the surface of the gate insulating film 102. Consequently, the surface of the gate insulating film 102 in the contact hole CH1 is etched in the same manner as in the first embodiment. As a result, the position of the upper surface of the gate insulating film 102 in the first region R1 is made to be lower than the position of the upper surface of the gate insulating film 102 in the second region R2 in the same manner as shown in FIG. 4B.

Figure 7F:
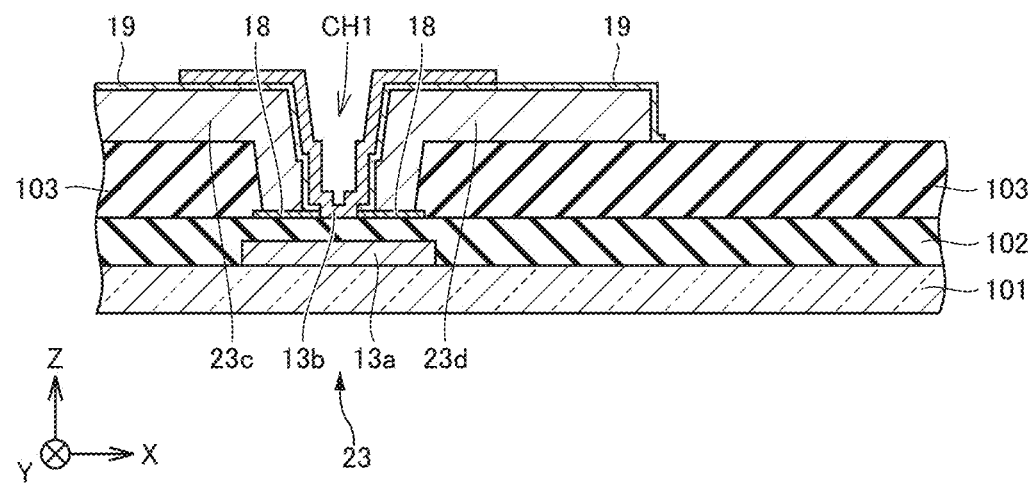
FIG. 7F is a sectional view showing a step of forming a semiconductor film on the conductive film after the step shown in FIG. 7E.

The semiconductor film 13b is formed on the conductive film 19 and the gate insulating film 102 in the contact hole CH1 by performing the same step as the step shown in FIG. 5G above (refer to FIG. 7F). In this manner, a TFT 23 is produced. In the present embodiment, the surface of the gate insulating film 102 is also cleaned before the semiconductor film 13b is formed. Consequently, the performance of the TFT 23 is improved compared with the case in which cleaning treatment is not performed.

Figure 7G:
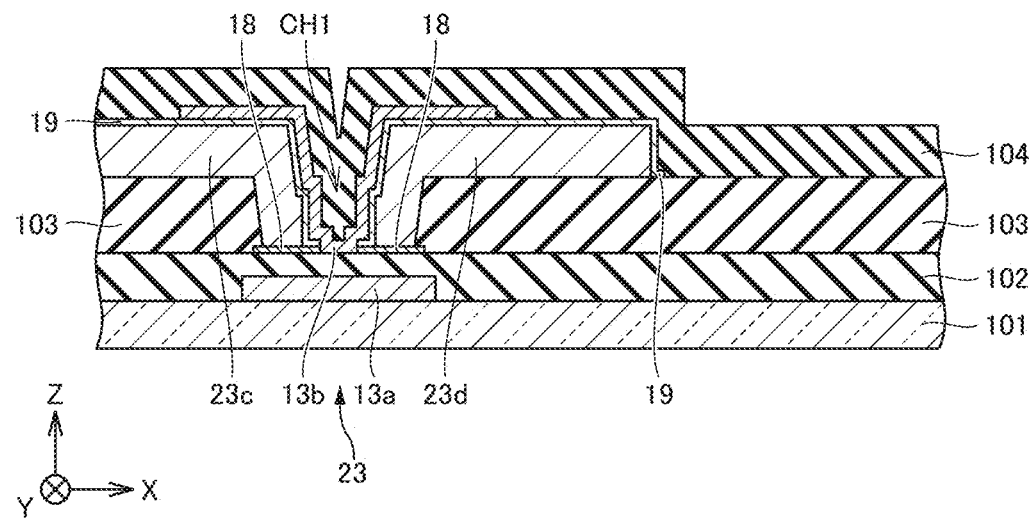
FIG. 7G is a sectional view showing a step of forming an inorganic insulating film that covers the semiconductor film after the step shown in FIG. 7F.

The inorganic insulating film 104 is formed above the semiconductor film 13b by performing the same step as the step shown in FIG. 5H above (refer to FIG. 7G). Thereafter, the active matrix substrate 10A (refer to FIG. 6) is produced by performing the same steps as the steps shown in FIG. 5I to FIG. 5L above.

Third Embodiment

In the above-described first and second embodiments, the example in which the protective film 18 formed of the metal material is used as the etching-stopper layer during formation of the opening 103a of the inorganic insulating film 103 is described. However, the etching-stopper layer is not limited to this. An example of the etching-stopper layer different from that in the first and second embodiments will be described below.

Figure 8A:
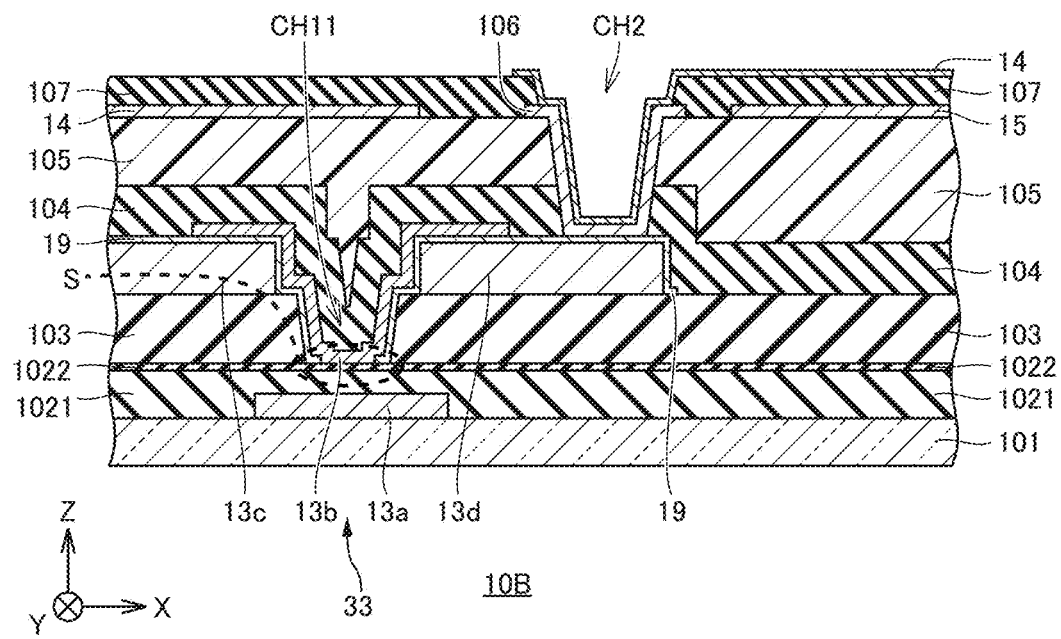
FIG. 8A is a sectional view of a pixel of an active matrix substrate in a third embodiment.
Figure 8B:
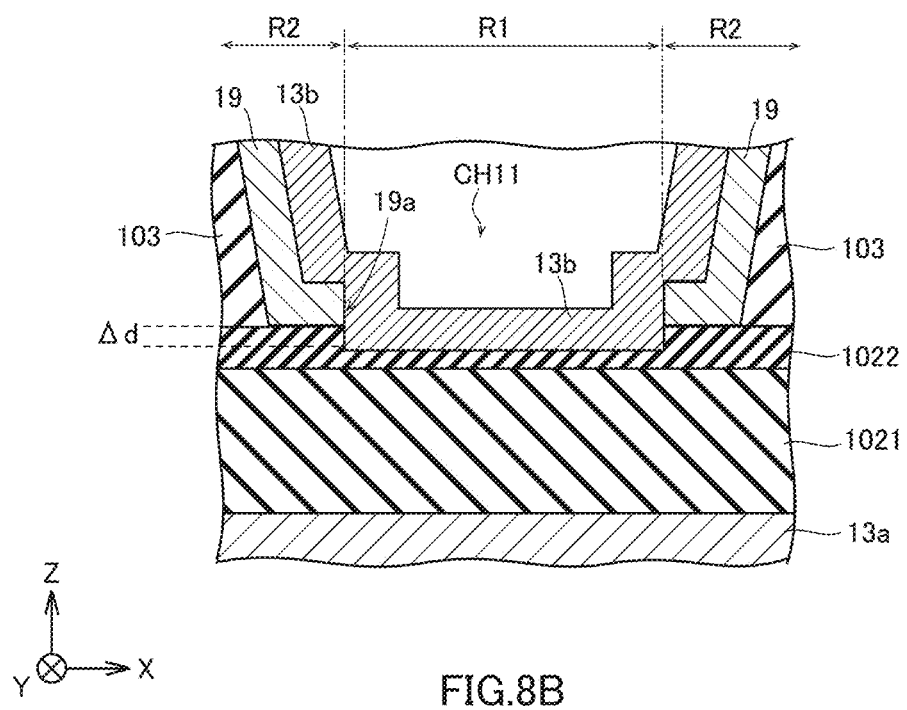
FIG. 8B is a magnified portion demarcated by broken line in the sectional view shown in FIG. 8A and is a diagram illustrating the film thickness of a gate insulating film in the third embodiment.

FIG. 8A is a sectional view showing the configuration of a pixel of an active matrix substrate 10B according to the present embodiment. FIG. 8B is a sectional view of a magnified portion demarcated by broken line S in FIG. 8A. In FIG. 8A and FIG. 8B, the same configurations as those in the first embodiment are indicated by the same references as in the first embodiment. Configurations different from those in the first embodiment will be described below.

As shown in FIGS. 8A and 8B, the active matrix substrate 10B is provided with a TFT 33. The TFT 33 includes a first gate insulating film 1021 and a second gate insulating film 1022 as gate insulating films. The second gate insulating film 1022 functions as an etching-stopper layer.

The first gate insulating film 1021 covers the gate electrode 13a, and the first gate insulating film 1021 is covered by the second gate insulating film 1022. The inorganic insulating film 103 and the conductive film 19 are disposed on the second gate insulating film 1022.

As shown in FIG. 8B, the contact hale CH11 is composed of the opening 19a in the conductive film 19, and the second gate insulating film 1022 is in contact with the semiconductor film 13b in the first region R1. Regarding the second gate insulating film 1022, the position of the upper surface (in the positive direction of the Z-axis) in the first region R1 is lower than the position of the upper surface (in the positive direction of the Z-axis) in the second region R2 by Δd. Consequently, the on-current of the TFT 33 is increased compared with the case in which the position of the upper surface of the second gate insulating film 1022 in the first region R1 is substantially equal to the position of the upper surface in the second region R2. Meanwhile, the position of the upper surface of the second gate insulating film 1022 in the second region R2 is higher than the position of the upper surface in the first region R1. Consequently, the withstand voltage is ensured by the first gate insulating film 1021, the second gate insulating film 1022, and the inorganic insulating film 103 between the gate electrode 13a and the source electrode 13c and between the gate electrode 13a and the drain electrode 13d.

The first gate insulating film 1021 is composed of the same material as the material for forming the gate insulating film 102 in the first embodiment.

The second gate insulating film 1022 may be, for example, an inorganic insulating film formed of silicon nitride (SiNx) or silicon oxide ($SiO_2$) or be composed of a multilayer film in which silicon nitride (SiNx) serving as a lower layer and silicon oxide ($SiO_2$) serving as an upper layer are stacked. However, it is favorable that the etching rate with respect to fluorine-based gas of the material used as the uppermost layer (in the positive direction of the Z-axis) of the second gate insulating film 1022 be less than the etching rate of the material used as the lowermost layer (in the negative direction of the Z-axis) of the inorganic insulating film 103. For example, in the case in which an inorganic insulating film formed of silicon nitride (SiNx) is disposed as the lowermost layer (in the negative direction of the Z-axis) of the inorganic insulating film 103, an inorganic insulating film formed of silicon oxide ($SiO_2$) is disposed as the uppermost layer of the second gate insulating film 1022. Since silicon oxide ($SiO_2$) exhibits a lower etching rate than silicon nitride (SiNx) with respect to fluorine-based gas, the second gate insulating film 1022 functions as an etching stopper with respect to etching of the inorganic insulating film 103.

A method for manufacturing the active matrix substrate 10B will be specifically described below.

Figure 9A:
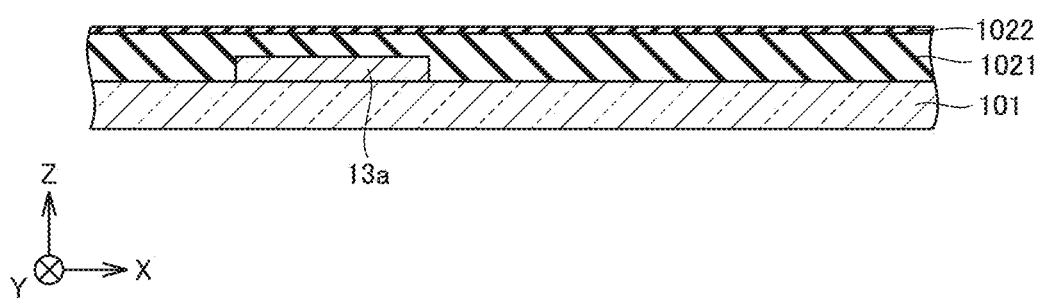
FIG. 9A is a sectional view illustrating a production step of the active matrix substrate shown in FIG. 8A and is a sectional view showing a step of forming a second gate insulating film after a gate electrode and a first gate insulating film are formed.

The same step as the step shown in FIG. 5A above is performed so as to form the first gate insulating film 1021. Thereafter, the second gate insulating film 1022 is formed of silicon nitride (SiNx) on the first gate insulating film 1021 by using, for example, a plasma CVD method (refer to FIG. 9A).

Figure 9B:
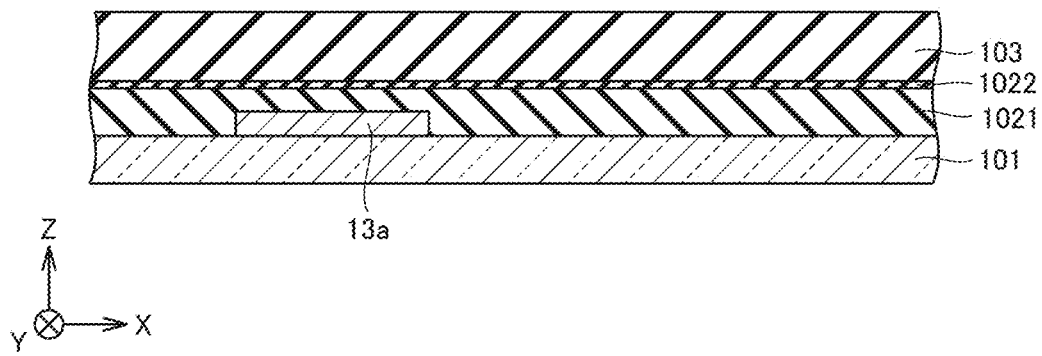
FIG. 9B is a sectional view showing a step of forming an inorganic insulating film on the second gate insulating film after the step shown in FIG. 9A.

The same step as the step shown in FIG. 5C above is performed so as to form the inorganic insulating film 103 on the second gate insulating film 1022 (refer to FIG. 9B).

Figure 9C:
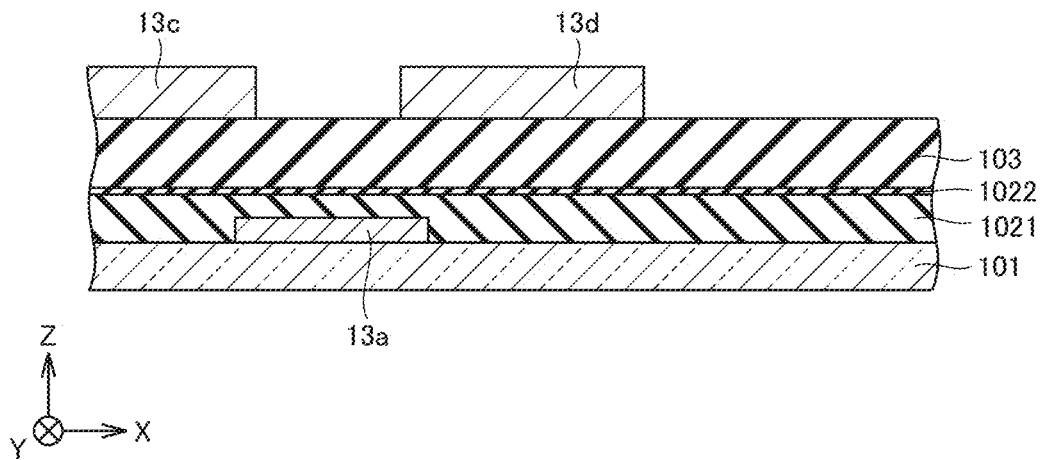
FIG. 9C is a sectional view showing a step of forming a source electrode and a drain electrode on the inorganic insulating film after the step shown in FIG. 9B.
Figure 9D:
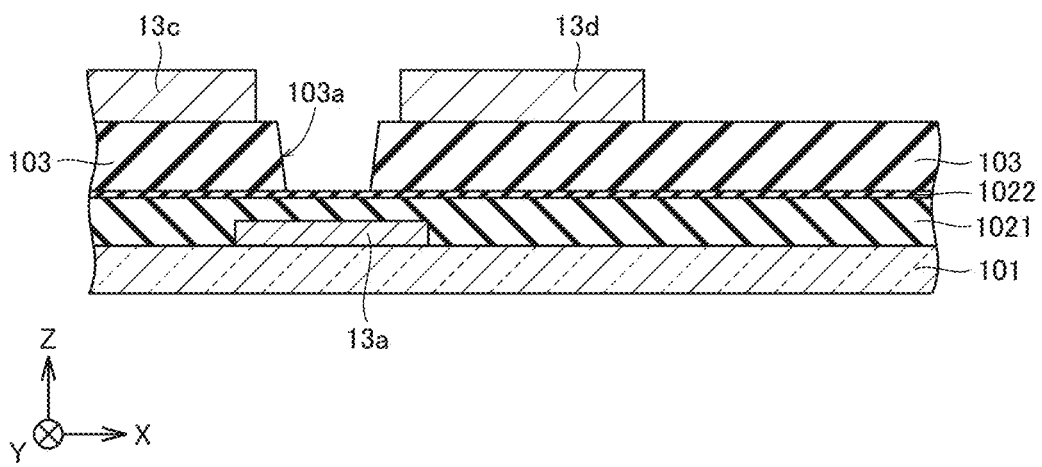
FIG. 9D is a sectional view showing a step of forming an opening of the inorganic insulating film after the step shown in FIG. 9C.

The same step as the step shown in FIG. 5D above is performed so as to form the source electrode 13c and the drain electrode 13d on the inorganic insulating film 103 (refer to FIG. 9C). The same step as the step shown in FIG. 5E above is performed so as to form the opening 103a of the inorganic insulating film 103 at the position overlapping the gate electrode 13a in plan view (refer to FIG. 9D).

Figure 9E:
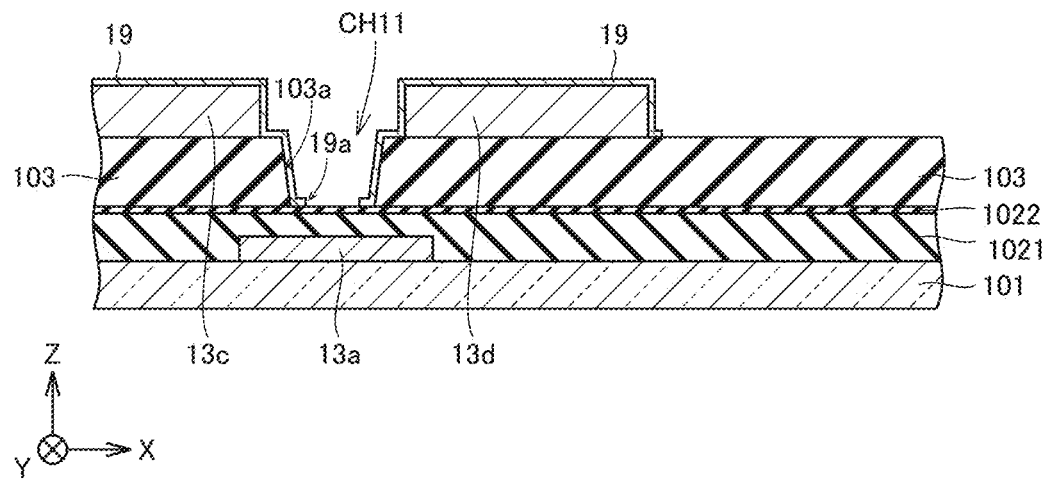
FIG. 9E is a sectional view showing a step of forming a conductive film that covers the source electrode and the drain electrode after the step shown in FIG. 9D.

The same step as the step shown in FIG. 5F above is performed so as to form the conductive film 19 having the opening 19a in the opening 103a (refer to FIG. 9E). The conductive film 19 covers the surfaces of the source electrode 13c and the drain electrode 13d and covers part of the upper surface of the inorganic insulating film 103 and the surface of the inorganic insulating film 103 in the opening 103a.

Figure 9F:
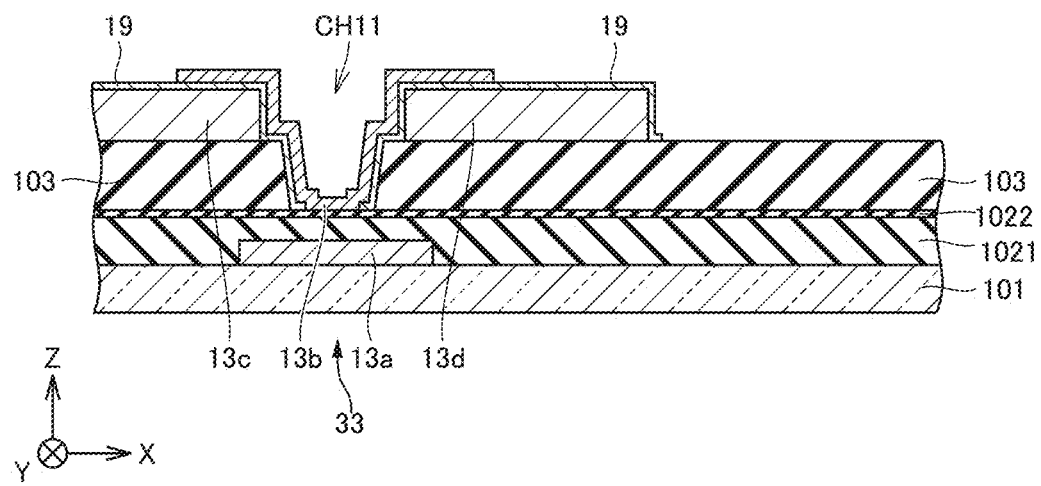
FIG. 9F is a sectional view showing a step of forming a semiconductor film on the conductive film after the step shown in FIG. 9E.

The surface of the second gate insulating film 1022 is subjected to cleaning treatment by using hydrofluoric acid. The same step as the step shown in FIG. 5G above is performed so as to form the semiconductor film 13b (refer to FIG. 9F). The semiconductor film 13b is in contact with the conductive film 19 and, in addition, in contact with the second gate insulating film 1022 in the contact hole CH11.

Thereafter, the active matrix substrate 10C (refer to FIG. 8B) is produced by performing the same steps as the steps shown in FIGS. 5H to 5L above.

In the present embodiment, sine the surface of the second gate insulating film 1022 is subjected to cleaning treatment by using hydrofluoric acid before the semiconductor film 13b is formed, the surface of the second gate insulating film 1022 in the contact hole CH11 is etched to some extent. However, the first gate insulating film 1021 covered by the second gate insulating film 1022 is not etched. Consequently, dust and the like on the surface of the second gate insulating film 1022 in contact with the semiconductor film 13b are removed, and the performance of the TFT 33 can be improved compared with the case in which cleaning treatment is not performed.

Up to this point, the embodiments according to the present disclosure have been described. However, the above-described embodiments are just examples of realizing the present disclosure. Therefore, the present disclosure is not limited to the above-described embodiments and can be appropriately modified and realized without departing from the gist of the disclosure. The modified examples of the present disclosure will be described below.

Figure 10:
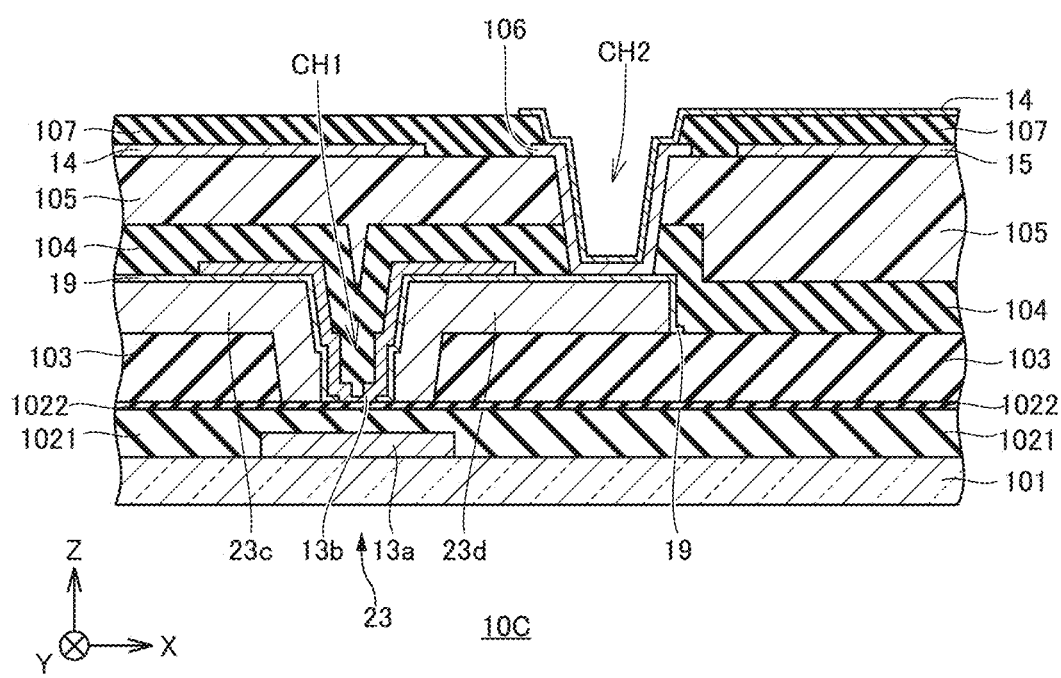
FIG. 10 is a sectional view of a pixel of an active matrix substrate in modified example (1).

(1) The active matrix substrate 10A according to the above-described second embodiment may have a configuration of, for example, an active matrix substrate 10C shown in FIG. 10. In the active matrix substrate 10C, the first gate insulating film 1021 and the second gate insulating film 1022 are disposed as the gate insulating film as in the third embodiment, and the protective film 18 (refer to FIG. 8A) is not disposed.

(2) In the above-described first embodiment to third embodiment, the example in which the surfaces of the source electrode and the drain electrode are covered by the conductive film 19 is described. To protect the source electrode and the drain electrode from the cleaning treatment by using hydrofluoric acid, it is favorable that the conductive film 19 be disposed. However, in the case in which the source electrode and the drain electrode are composed of a conductive material having etching resistance to an acid aqueous solution containing fluorine, the conductive film 19 is not limited to being disposed.

(3) In the above-described first embodiment and second embodiment, a multilayer film in which titanium (Ti), aluminum (Al), and titanium (Ti) are successively stacked is formed as the source-drain film, but the multilayer film may be formed by stacking molybdenum nitride (MoN), titanium (Ti), and molybdenum nitride (MoN). In this case, regarding etching of the source-drain film, etching is performed by using an etchant containing phosphoric acid, acetic acid, and nitric acid.

(4) In the above-described first to third embodiments, the example in which the active matrix substrate 10 is used for the liquid crystal display device is described. However, application is not limited to the liquid crystal display device provided that the TFT 13, 23, or 33 is disposed on a per-pixel basis in the active matrix substrate. For example, the active matrix substrate in which each pixel includes a TFT may be applied to an organic EL display. In addition, an active matrix substrate in which each pixel includes a TFT and a photoelectric conversion element connected to the TFT may be applied to an imaging panel of X-rays and the like.

The above-described active matrix substrate and method for manufacturing the same can be described as follows.

An active matrix substrate according to a first configuration includes a substrate and a thin film transistor, wherein the thin film transistor includes a gate electrode disposed on the substrate, a first inorganic insulating film that covers the gate electrode, a second inorganic insulating film that is disposed on the first inorganic insulating film and that has an opening in a region overlapping the gate electrode in plan view, a source electrode and a drain electrode that overlap the gate electrode in plan view and that cover part of the second inorganic insulating film, and a semiconductor layer that overlaps the gate electrode in the opening in plan view and that covers the source electrode and the drain electrode, and regarding a surface of the first inorganic insulating film in a first region overlapping the opening in plan view and a surface of the first inorganic insulating film in a second region other than the first region, the surfaces being arranged nearer to the second inorganic insulating film with respect to the first inorganic insulating film, the position of the surface in the first region is lower than the position of the surface in the second region.

According to the first configuration, the gate electrode is covered by the first inorganic insulating film, and the second inorganic insulating film having the opening that overlaps the gate electrode in plan view is disposed on the first inorganic insulating film. The source electrode and the drain electrode are arranged at a distance from each other on the second inorganic insulating film. The semiconductor layer overlaps the gate electrode in the opening of the second inorganic insulating film in plan view and covers the source electrode and the drain electrode. Regarding the first inorganic insulating film, the position of the surface in the first region overlapping the opening in plan view is lower than the position of the surface in the second region, the surfaces being arranged nearer to the second inorganic insulating film with respect to the first inorganic insulating film. As the film thickness of the first inorganic insulating film corresponding to the channel region of the thin film transistor decreases, the electric field strength during conduction of the thin film transistor is enhanced, and the on-current of the thin film transistor is increased. Consequently, the on-current of the thin film transistor is increased compared with the case in which, in the first region and the second region of the first inorganic insulating film, the surfaces arranged nearer to the second inorganic insulating film are at equal height. Meanwhile, regarding the thin film transistor, the electrostatic withstand voltage is increased as the film thicknesses of the first inorganic insulating film and the second inorganic insulating film between the source electrode and the gate electrode and between the drain electrode and the gate electrode increase. Regarding the first inorganic insulating film, the surface in the second region is higher than the surface in the first region, the surfaces being arranged nearer to the second inorganic insulating film. Consequently, the electrostatic withstand voltage between the source electrode and the gate electrode and the electrostatic withstand voltage between the drain electrode and the gate electrode are ensured, and electrostatic breakdown of the thin film transistor is suppressed.

In the first configuration, the first inorganic insulating film may include a first gate insulating layer and a second gate insulating layer formed of a material different from the material for forming the first gate insulating layer, the first gate insulating layer may cover the gate electrode, the second gate insulating layer may cover the first gate insulating layer, and regarding a surface of the second gate insulating layer in the first region and a surface of the second gate insulating layer in the second region, the surfaces being arranged nearer to the second inorganic insulating film with respect to the first inorganic insulating film, the position of the surface in the first region may be lower than the position of the surface in the second region (second configuration).

According to the second configuration, the first inorganic insulating film is composed of the first gate insulating layer covering the gate electrode and the second gate insulating layer covering the first gate insulating layer. Regarding the second gate insulating layer, the surface in the first region is lower than the surface in the second region, the surfaces being arranged nearer to the second inorganic insulating film with respect to the first inorganic insulating film. Consequently, the on-current of the thin film transistor is increased compared with the case in which, in the first region and the second region of the second gate insulating layer, the surfaces arranged in the above-described direction are at an equal height.

In the first configuration, the source electrode and the drain electrode may cover part of the surface of the second inorganic insulating film outside the opening and, in addition, may cover the surface of the second inorganic insulating film inside the opening (third configuration).

In any one of the first configuration to the third configuration, a conductive film that covers the surfaces of the source electrode and the drain electrode and that has etching resistance to an acid aqueous solution containing fluorine may be further included, wherein the semiconductor layer may cover the source electrode and the drain electrode above the conductive film (fourth configuration).

According to the fourth configuration, the source electrode and the drain electrode are covered by the semiconductor layer with the conductive film having etching resistance to an acid aqueous solution containing fluorine interposed therebetween. Consequently, in the process of forming the active matrix substrate, even when the surface of the first inorganic insulating film is cleaned by using hydrofluoric acid or the like before the semiconductor layer is formed, the source electrode and the drain electrode are not etched, and the performance of the thin film transistor can be improved.

In the first configuration or the third configuration, a protective film may be further disposed on the first inorganic insulating film so as to interpose the first region in plan view, wherein the first region may be arranged inside the opening in plan view, and part of the protective film may be covered by the second inorganic insulating film outside the opening (fifth configuration).

A first method for manufacturing an active matrix substrate is a method for manufacturing an active matrix substrate including a thin film transistor and includes forming a gate electrode on a substrate, forming a first inorganic insulating film that covers the gate electrode, forming a second inorganic insulating film on the first inorganic insulating film, forming a first opening of the second inorganic insulating film in a region that overlaps the gate electrode in plan view, forming a source electrode and a drain electrode that overlap the gate electrode in plan view on the second inorganic insulating film, subjecting the surface of the first inorganic insulating film to cleaning treatment, and forming a semiconductor layer on the source electrode and the drain electrode so as to overlap the gate electrode in plan view in the first opening, wherein, regarding a surface of the first inorganic insulating film in a first region overlapping the first opening in plan view and a surface of the first inorganic insulating film in a second region other than the first region, the surfaces being arranged nearer to the second inorganic insulating film with respect to the first inorganic insulating film, the position of the surface in the first region may be lower than the position of the surface in the second region by the cleaning treatment.

According to the first method for manufacturing the active matrix substrate, the gate electrode is covered by the first inorganic insulating film, and the second inorganic insulating film having the first opening that overlaps the gate electrode in plan view is disposed on the first inorganic insulating film. The source electrode and the drain electrode are disposed on the second inorganic insulating film. The semiconductor layer overlaps the gate electrode in plan view in the first opening of the second inorganic insulating film and covers the source electrode and the drain electrode. The surface of the first inorganic insulating film is cleaned before the semiconductor layer is formed, and regarding the first inorganic insulating film, the position of the surface in the first region overlapping the first opening in plan view is made to be lower than the position of the surface in the second region, the surfaces being arranged nearer to the second inorganic insulating film with respect to the first inorganic insulating film, by the cleaning treatment. As the film thickness of the first inorganic insulating film corresponding to the channel region of the thin film transistor decreases, the electric field strength during conduction of the thin film transistor is enhanced, and the on-current of the thin film transistor is increased. Consequently, the on-current of the thin film transistor is increased compared with the case in which the heights in the first region and the second region of the first inorganic insulating film are equal. Meanwhile, regarding the thin film transistor, the electrostatic withstand voltage is increased as the film thickness of the first inorganic insulating film and the second inorganic insulating film between the source electrode and the gate electrode and between the drain electrode and the gate electrode increase. Regarding the first inorganic insulating film, the position of the surface in the second region is higher than the position of the surface in the first region, the surfaces being arranged nearer to the second inorganic insulating film. Consequently, the electrostatic withstand voltage between the source electrode and the gate electrode and the electrostatic withstand voltage between the drain electrode and the gate electrode are ensured, and electrostatic breakdown of the thin film transistor does not readily occur. Meanwhile, the semiconductor layer is formed after the surface of the first inorganic insulating film is cleaned. Consequently, the defect level at the interface between the semiconductor layer and the first inorganic insulating film is reduced compared with the case in which cleaning treatment is not performed, and the performance of the thin film transistor is improved.

In the first method for manufacturing an active matrix substrate, forming a protective film on the first inorganic insulating film so as to overlap the gate electrode in plan view, forming a conductive film that has etching resistance to an acid aqueous solution containing fluorine and that covers the surfaces of the source electrode and the drain electrode before the cleaning treatment, and forming a second opening of the protective film inside the first opening after the forming of the source electrode and the drain electrode may be further included, wherein the cleaning treatment may be performed by using an etchant containing fluorine after the second opening is formed (second method for manufacturing an active matrix substrate).

According to the second method for manufacturing an active matrix substrate, the gate electrode is covered by the first inorganic insulating film and the protective film. Consequently, even when wet etching or dry etching is performed during formation of the first opening of the second inorganic insulating film, the surface of the first inorganic insulating film on the gate electrode is not damaged by the etching. Meanwhile, the surfaces of the source electrode and the drain electrode are covered by the conductive film that has etching resistance to an acid aqueous solution containing fluorine. Consequently, the source electrode and the drain electrode are not damaged by etching during cleaning of the surface of the first inorganic insulating film in the second opening by using an etchant containing fluorine.

In the first method for manufacturing an active matrix substrate, the forming of a first inorganic insulating film may include forming a first gate insulating film that covers the gate electrode and forming a second gate insulating film that covers the first gate insulating film, the etching selection ratio of the second inorganic insulating film to the second gate insulating film may be high, and regarding a surface of the second gate insulating film in the first region and a surface of the second gate insulating film in the second region, the surfaces being arranged nearer to the second inorganic insulating film with respect to the first inorganic insulating film, the position of the surface in the first region may be made to be lower than the position of the surface in the second region by performing the cleaning treatment (third method for manufacturing an active matrix substrate).

According to the third method for manufacturing an active matrix substrate, the gate electrode is covered by the first gate insulating film and the second gate insulating film. The second gate insulating film is disposed on the first gate insulating film, and the second inorganic insulating film is disposed on the second gate insulating film. The etching selection ratio of the second gate insulating film to the second inorganic insulating film is low. Consequently, even when wet etching or dry etching is performed during formation of the first opening of the second inorganic insulating film, the second gate insulating film is not readily etched, and the first gate insulating film on the gate electrode is protected. Regarding the second gate insulating film, the position of the surface in the first region is lower than the position of the surface in the second region, the surfaces being arranged nearer to the second inorganic insulating film. Consequently, the on-current of the thin film transistor is increased compared with the case in which, in the first region and the second region of the second gate insulating layer, the surfaces arranged nearer to the second inorganic insulating film are at equal height.

In the third method for manufacturing an active matrix substrate, forming a conductive film that has etching resistance to an acid aqueous solution containing fluorine and that covers the surfaces of the source electrode and the drain electrode may be further included before the cleaning treatment (fourth method for manufacturing an active matrix substrate).

According to the fourth method for manufacturing an active matrix substrate, the source electrode and the drain electrode are covered by the conductive film that has etching resistance to an acid aqueous solution containing fluorine. Consequently, the source electrode and the drain electrode are not etched so as to be protected even when cleaning treatment is performed by using an etchant containing fluorine.

The present disclosure contains subject matter related to that disclosed in U.S. Provisional Patent Application No. 62/839,936 filed in the US Patent Office on Apr. 29, 2019, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix substrate comprising a substrate and a thin film transistor,
   wherein the thin film transistor includes
   a gate electrode disposed on the substrate,
   a first inorganic insulating film that covers the gate electrode,
   a second inorganic insulating film that is disposed on the first inorganic insulating film and that has an opening in a region overlapping the gate electrode in plan view,
   a source electrode and a drain electrode that overlap the gate electrode in plan view and that cover part of the second inorganic insulating film,
   a semiconductor layer that overlaps the gate electrode in the opening in plan view and that covers the source electrode and the drain electrode, and
   a protective film; wherein
   regarding a surface of the first inorganic insulating film in a first region that overlaps the opening in plan view and a surface of the first inorganic insulating film in a second region other than the first region, the surfaces being arranged nearer to the second inorganic insulating film with respect to the first inorganic insulating film, the position of the surface in the first region is lower than the position of the surface in the second region,
   the protective film is provided on the first inorganic insulating film so as to interpose the first region in plan view,
   the first region is arranged inside the opening in plan view, and
   part of the protective film is covered by the second inorganic insulating film outside the opening.

2. The active matrix substrate according to claim 1,
   wherein the first inorganic insulating film includes a first gate insulating layer and a second gate insulating layer that is formed of a material different from the material for forming the first gate insulating layer,
   the first gate insulating layer covers the gate electrode,
   the second gate insulating layer covers the first gate insulating layer, and
   regarding a surface of the second gate insulating layer in the first region and a surface of the second gate insulating layer in the second region, the surfaces being arranged nearer to the second inorganic insulating film with respect to the first inorganic insulating film, the position of the surface in the first region is lower than the position of the surface in the second region.

3. The active matrix substrate according to claim 1, wherein the source electrode and the drain electrode cover part of the surface of the second inorganic insulating film outside the opening and, in addition, cover the surface of the second inorganic insulating film inside the opening.

4. The active matrix substrate according to claim 1, further comprising a conductive film that covers the surfaces of the source electrode and the drain electrode and that has etching resistance to an acid aqueous solution containing fluorine,
   wherein the semiconductor layer covers the source electrode and the drain electrode above the conductive film.

5. A method for manufacturing an active matrix substrate including a thin film transistor, comprising:

forming a gate electrode on a substrate;
forming a first inorganic insulating film that covers the gate electrode;
forming a second inorganic insulating film on the first inorganic insulating film;
forming a first opening of the second inorganic insulating film in a region that overlaps the gate electrode in plan view;
forming a source electrode and a drain electrode on the second inorganic insulating film so as to overlap the gate electrode in plan view;
subjecting the surface of the first inorganic insulating film to cleaning treatment; and
forming a semiconductor layer on the source electrode and the drain electrode so as to overlap the gate electrode in plan view in the first opening,
wherein, regarding a surface of the first inorganic insulating film in a first region that overlaps the first opening in plan view and a surface of the first inorganic insulating film in a second region other than the first region, the surfaces being arranged nearer to the second inorganic insulating film with respect to the first inorganic insulating film, the position of the surface in the first region is made to be lower than the position of the surface in the second region by the cleaning treatment,
the method further comprises:
forming a protective film on the first inorganic insulating film so as to overlap the gate electrode plan view;
forming a conductive film that has etching resistance to an add aqueous solution containing fluorine and that covers the surfaces of the source electrode and the drain electrode before the cleaning treatment; and
forming a second opening of the protective film inside the first opening after the forming of the source electrode and the drain electrode, and
the cleaning treatment is performed by using an etchant containing fluorine after the second opening is formed.

6. A method for manufacturing an active matrix substrate including a thin film transistor, comprising:
forming a gate electrode on a substrate;
forming a first inorganic insulating film that covers the gate electrode;
forming a second inorganic insulating film on the first inorganic insulating film;
forming a first opening of the second inorganic insulating film in a region that overlaps the gate electrode in plan view;
forming a source electrode and a drain electrode on the second inorganic insulating film so as to overlap the gate electrode in plan view;
subjecting the surface of the first inorganic insulating film to cleaning treatment; and
forming a semiconductor layer on the source electrode and the drain electrode so as to overlap the gate electrode in plan view in the first opening,
wherein, regarding a surface of the first inorganic insulating film in a first region that overlaps the first opening in plan view and a surface of the first inorganic insulating film in a second region other than the first region, the surfaces being arranged nearer to the second inorganic insulating film with respect to the first inorganic insulating film, the position of the surface in the first region is made to be lower than the position of the surface in the second region by the cleaning treatment,
the forming of a first inorganic insulating film includes forming a first gate insulating film that covers the gate electrode and forming a second gate insulating film that covers the first gate insulating film,
the etching selection ratio of the second inorganic insulating film to the second gate insulating film is high, and
regarding a surface of the second gate insulating film in the first region and a surface of the second gate insulating film in the second region, the surfaces being arranged nearer to the second inorganic insulating film with respect to the first inorganic insulating film, the position of the surface in the first region is lower than the position of the surface in the second region.

7. The method for manufacturing an active matrix substrate according to claim 6, further comprising forming a conductive film that has etching resistance to an acid aqueous solution containing fluorine and that covers the surfaces of the source electrode and the drain electrode before the cleaning treatment.

* * * * *